US011522736B2

(12) United States Patent
Park et al.

(10) Patent No.: US 11,522,736 B2
(45) Date of Patent: Dec. 6, 2022

(54) ANALOG FRONT-END RECEIVER AND ELECTRONIC DEVICE INCLUDING THE SAME RECEIVER

(71) Applicant: Samsung Electronics Co., Ltd., Suwon-si (KR)

(72) Inventors: Byeong Gyu Park, Hwaseong-si (KR); Jun Han Bae, Hwaseong-si (KR); Yun Geun Nam, Anyang-si (KR); Jae Hyun Park, Seoul (KR); Gyeong Seok Song, Busan (KR); Ho-Bin Song, Daejeon (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/461,070

(22) Filed: Aug. 30, 2021

(65) Prior Publication Data
US 2022/0141056 A1 May 5, 2022

(30) Foreign Application Priority Data

Oct. 29, 2020 (KR) .......................... 10-2020-0142265

(51) Int. Cl.
*H04L 25/03* (2006.01)
*H03F 3/45* (2006.01)
(Continued)

(52) U.S. Cl.
CPC ... *H04L 25/03057* (2013.01); *H03F 3/45475* (2013.01); *H04B 1/18* (2013.01); *H04B 3/08* (2013.01); *H04L 25/03885* (2013.01)

(58) Field of Classification Search
CPC .......... H03F 3/4547; H04B 1/10; H04B 1/18; H04B 3/04; H04B 3/08; H04L 25/03006;
(Continued)

(56) References Cited

U.S. PATENT DOCUMENTS 5,587,709 A * 12/1996 Jeong ...................... H03M 9/00
341/100
6,011,435 A * 1/2000 Takeyabu ............ H03F 3/45475
330/252

(Continued)

*Primary Examiner* — Young T. Tse
(74) *Attorney, Agent, or Firm* — Harness, Dickey & Pierce, P.L.C.

(57) ABSTRACT

An analog front-end receiver including a termination resistor configured to receive first and second differential signals from different data lines, the second differential signal being differential with respect to the first differential signal, an active equalizer configured to receive a first input differential signal through a first input node and a second input differential signal through a second input node, the first and second input differential signals both having an input common mode voltage, the first and second input differential signals being based on the first and second differential signal, respectively, and output first and output differential signals to first and second output nodes, respectfully, the second output differential signal being differential with respect to the first output differential signal, and an input common mode voltage generator configured to adjust the input common mode voltage to be equal to an output common mode voltage of the first output differential signal.

20 Claims, 18 Drawing Sheets

(51) Int. Cl.
*H04B 1/18* (2006.01)
*H04B 3/08* (2006.01)

(58) Field of Classification Search
CPC ......... H04L 25/03019; H04L 25/03031; H04L 25/03038; H04L 25/03057; H04L 25/03885
USPC ....... 375/219, 232, 233, 324, 326, 346, 348; 455/334, 338, 340, 341; 708/322, 323
See application file for complete search history.

(56) References Cited

U.S. PATENT DOCUMENTS

| | | | |
|---|---|---|---|
| 6,677,822 B2 | 1/2004 | Hasegawa | |
| 7,190,742 B2 * | 3/2007 | Popescu | H03H 15/00 375/326 |
| 8,446,173 B1 | 5/2013 | Faucher et al. | |
| 9,160,323 B2 | 10/2015 | Yoo | |
| 9,515,854 B2 | 12/2016 | Scouten | |
| 9,602,315 B2 | 3/2017 | Islam et al. | |
| 9,647,618 B1 | 5/2017 | Yuan et al. | |
| 10,038,574 B2 | 7/2018 | Islam et al. | |
| 10,298,426 B2 | 5/2019 | Maeda et al. | |
| 10,523,470 B1 | 12/2019 | Hu | |
| 2007/0025435 A1* | 2/2007 | Cao | H03G 1/0029 375/229 |
| 2019/0207789 A1 | 7/2019 | Kim et al. | |
| 2020/0204131 A1 | 6/2020 | Forey et al. | |

* cited by examiner

ANALOG FRONT-END RECEIVER AND ELECTRONIC DEVICE INCLUDING THE SAME RECEIVER

CROSS-REFERENCE TO RELATED APPLICATION

This application claims priority from Korean Patent Application No. 10-2020-0142265 filed on Oct. 29, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to an analog front-end receiver and an electronic device including the same receiver.

2. Description of the Related Art

In accordance with a change in a test environment for testing an electronic device, a change in the operating temperature of the electronic device, and the like, values representing electrical characteristics of elements or devices included in the electronic device, equivalent values, and the like, may be changed.

Due to the changes, it may not be possible to secure the levels of electrical signals such as a voltage, a current, and the like used for operating each component of the electronic device. Therefore, it is desirable to perform an adjustment operation for normal operation of the electronic device.

Particularly, in order to drive a transistor, a common mode voltage that is appropriate for the type of the transistor should be inputted, and a system for adjusting the common mode voltage of an inputted signal should be included in an integrated processor (IP) block, or the like, including a transistor.

SUMMARY

Some embodiments provide an analog front-end receiver including a feedback system capable of matching an input common mode voltage of an active equalizer with an output common mode voltage thereof.

Some embodiments provide an analog front-end receiver including a feedback system capable of maintaining an input common mode voltage of an active equalizer at a constant level.

However, some embodiments are not restricted to those set forth herein. The above and other aspects of the present disclosure will become more apparent to one of ordinary skill in the art to which the present disclosure pertains by referencing the detailed description of the present disclosure given below.

According to some embodiments, there is provided an analog front-end receiver including a termination resistor configured to receive a first differential signal and a second differential signal from different data lines, the second differential signal being differential with respect to the first differential signal, an active equalizer configured to receive a first input differential signal through a first input node and a second input differential signal through a second input node, the first input differential signal and the second input differential signal both having an input common mode voltage, the first input differential signal being based on the first differential signal, and the second input differential signal being based on the second differential signal, and output a first output differential signal to a first output node and a second output differential signal to a second output node, the second output differential signal being differential with respect to the first output differential signal, and an input common mode voltage generator configured to adjust the input common mode voltage to be equal to an output common mode voltage of the first output differential signal.

According to some embodiments, there is provided an analog front-end receiver including a termination resistor configured to receive a first differential signal and a second differential signal from different data lines, the second differential signal being differential with respect to the first differential signal, an active equalizer configured to receive a first input differential signal through a first input node and a second input differential signal through a second input node, the first input differential signal and the second input differential signal both having an input common mode voltage, the first input differential signal being based on the first differential signal, and the second input differential signal being based on the second differential signal, and output a first output differential signal to a first output node and a second output differential signal to a second output node, the second output differential signal being differential with respect to the first output differential signal, and an input common mode voltage generator configured to receive a reference voltage related to the first output differential signal and the second output differential signal, provide a common mode current to each of the first input node and the second input node based on the reference voltage, and maintain the input common mode voltage within a range based on the reference voltage.

According to some embodiments, there is provided an electronic device including a physical layer configured to receive a first differential signal and a second differential signal through an interface, the second differential signal being differential with respect to the first differential signal, and output digital data corresponding to the first differential signal and the second differential signal, a link layer configured to output a control signal to a driving device based on the digital data, and the driving device in which a program is executed based on the control signal, wherein the physical layer includes a termination resistor configured to receive the first differential signal transmitted and the second differential signal from different data lines, an active equalizer configured to, receive a first input differential signal through a first input node and a second input differential signal through a second input node, the first input differential signal and the second differential signal both having an input common mode voltage, the first input differential signal being based on the first differential signal, and the second input differential signal being based on the second differential signal, and to output a first output differential signal to a first output node and a second output differential signal to a second output node, the second output differential signal being differential with respect to the first output differential signal, and an input common mode voltage generator configured to adjust the input common mode voltage to be equal to an output common mode voltage of the first output differential signal.

According to some embodiments, there is provided an analog front-end receiver including a termination resistor configured to receive a first differential signal and a second differential signal from different data lines, the second differential signal being differential with respect to the first differential signal, an active equalizer configured to receive a first input differential signal through a first input node and a second input differential signal through a second input node, the first input differential signal and the second input differential signal both having an input common mode voltage, the first input differential signal being based on the first differential signal, and the second input differential signal being based on the second differential signal, and to output a first output differential signal to a first output node and a second output differential signal to a second output node, the second output differential signal being differential with respect to the first output differential signal, and an input common mode voltage generator configured to receive the first output differential signal and an output common mode voltage of the first output differential signal, provide a common mode current to each of the first input node and the second input node based on the output common mode voltage, and maintain the input common mode voltage within a range based on the output common mode voltage.

BRIEF DESCRIPTION OF THE DRAWINGS

The above and other aspects and features of the present disclosure will become more apparent by describing in detail some embodiments thereof with reference to the attached drawings, in which.

DETAILED DESCRIPTION

Hereinafter, some embodiments of the present disclosure will be described with reference to the accompanying drawings. In the following description made with reference to FIGS. 1 to 18, the same reference numbers are used to refer to substantially the same components, and a redundant description of the corresponding components will be omitted. Like reference numbers refer to like elements throughout the various drawings.

Figure 1:
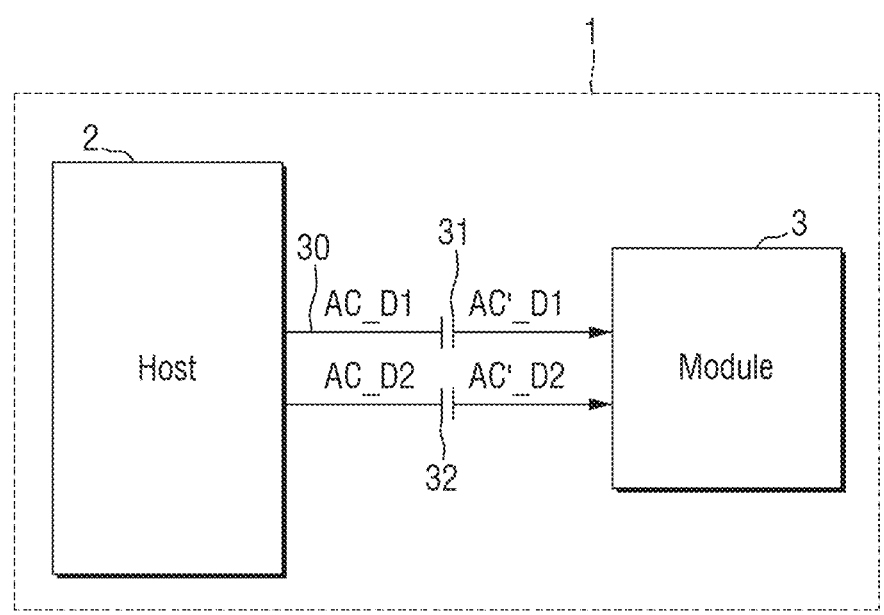
FIG. 1 is a block diagram illustrating an electronic system according to some embodiments of the present disclosure.
Figure 2:
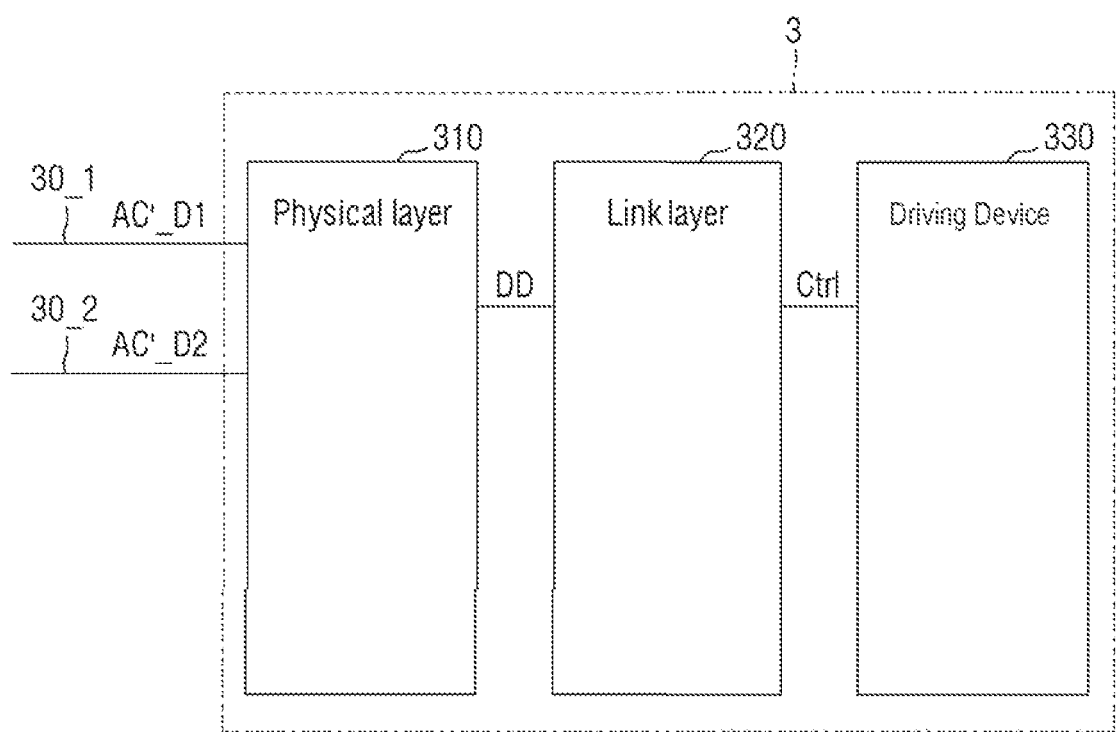
FIG. 2 is a block diagram illustrating a module according to some embodiments of the present disclosure.
Figure 3:
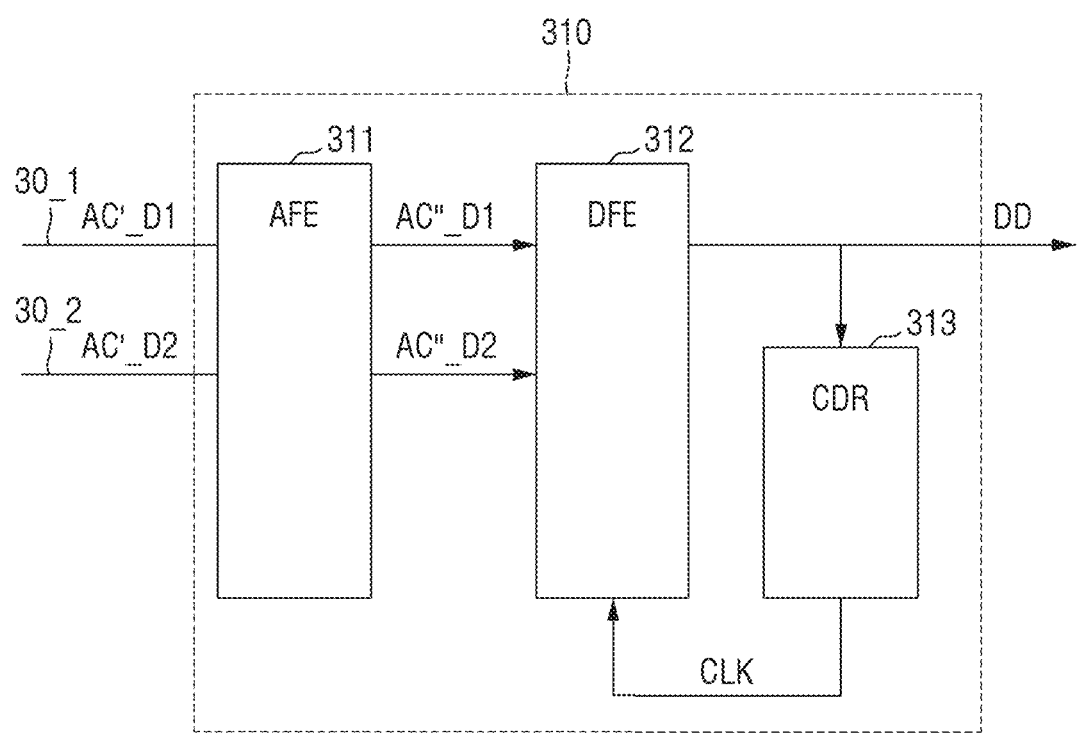
FIG. 3 is a block diagram illustrating a physical layer according to some embodiments of the present disclosure.

FIG. 1 is a block diagram illustrating an electronic system according to some embodiments of the present disclosure. FIG. 2 is a block diagram illustrating a module according to some embodiments of the present disclosure. FIG. 3 is a block diagram illustrating a physical layer according to some embodiments of the present disclosure.

Referring to FIGS. 1 to 3, an electronic system 1 according to some embodiments of the present disclosure may include a host 2, a module 3, and/or a high-speed signal channel 30.

The electronic system 1 may be implemented as a smartphone, a tablet personal computer (table PC), a camera, a personal digital assistant (PDA), a digital recorder, an MP3 player, an internet tablet, a mobile internet device (MID), a wearable computer, an electronic toy, etc.

The host 2 may control one or more modules 3 (electronic devices). For example, the host 2 may be implemented as a system on chip, and/or hardware or a circuit implemented in an application processor (IC).

Although a single host 2 is illustrated in FIG. 1, a plurality of hosts may operate. A part of circuits, or a part of hardware, of the host 2 may operate as a separate host with respect to the module 3.

The host 2 may control the operation of the module 3 by the internal interface and the high-speed signal channel 30. The internal interface of the host 2 may include a link layer (e.g., peripheral component interconnect express (PCIe) Data Link) and a physical layer (e.g., PCIe PHY) in relation to the module 3. However, some embodiments of the present disclosure are not limited to the above examples, and the host 2 may provide first and second high-speed differential signals AC_D1 and AC_D2 to the module 3 through first and second high-speed data lines 30_1 and 30_2 included in the high-speed signal channel 30. The first and second high-speed differential signals AC_D1 and AC_D2 may include alternating current electrical signals AC having a frequency higher than 100 Mhz.

The module 3 that is an electronic device may be implemented as a calculation device for input data. It may receive first and second DC-blocked high-speed differential signals AC'_D1 and AC'_D2 that are DC-blocked through the first and second high-speed data lines 30_1 and 30_2 included in the high-speed signal channel 30. The module 3 may be configured with a central processor unit (CPU), a microprocessor unit (MPU), an application specific integrated circuit (ASIC), a storage device, a modem chip, a WiFi module, a global navigation satellite system (GNSS), and/or the like. Some embodiments of the present disclosure are not limited to the above examples, and will be described while focusing on the module 3 for simplicity of description.

The module 3 may include a physical layer 310, a link layer 320, and/or a driving device 330.

The physical layer 310 of the module 3 may transmit and receive data between the host 2 and the module 3 to transmit and receive an analog electrical signal to and from the external interface. Before the first and second high-speed differential signals AC_D1 and AC_D2 that are analog signals are provided from the host 2 to the physical layer 310, DC signals may be blocked by first and second DC block capacitors 31 and 32. The physical layer 310 of the module 3 may receive the first and second DC-blocked high-speed differential signals AC'_D1 and AC'_D2 and provide digital data DD1 (depicted in FIG. 2 as digital data DD) to the link layer 320. The physical layer 310 may provide the digital data DD1 to the link layer 320. On the contrary, the physical layer 310 may receive the digital data from the link layer 320 and provide the high-speed differential signals that are analog signals to the host 2. For example, the physical layer 310 of the module 3 may include PCIe PHY, although some embodiments are not limited thereto.

The physical layer 310 may include an analog front-end receiver (AFE) 311, a decision feedback equalizer (DFE) 312, and/or a clock-data recovery (CDR) 313.

A detailed description of the circuit structure of the analog front-end receiver 311 will be described later. The analog front-end receiver 311 may receive the first and second DC-blocked high-speed differential signals AC'_D1 and AC'_D2, control an input common mode voltage through feedback on the first and second DC-blocked high-speed differential signals AC'_D1 and AC'_D2, and perform signal amplification, thereby outputting output differential signals.

The analog front-end receiver 311 may receive the first and second DC-blocked high-speed differential signals AC'_D1 and AC'_D2, remove, reduce or compensate for channel distortion such as intersymbol interference (ISI), and filter noise received from the channel, thereby outputting first and second output differential signals AC"_D1 and AC"_D2.

The decision feedback equalizer 312 may perform sampling on the first and second output differential signals AC"_D1 and AC"_D2, additionally remove, reduce or compensate for channel distortion in the sampled signal, and filter noise received from the channel, thereby outputting the digital data DD.

The clock-data recovery 313 may extract a clock signal CLK based on the digital data DD, eliminate or reduce a phase difference between the digital data DD and the clock signal CLK, and synchronize the rising edge of the digital data DD with the rising edge of the clock signal CLK. The phase difference between the digital data DD and the clock signal CLK may be eliminated or reduced by providing the synchronized clock signal CLK to the decision feedback equalizer 312.

The link layer 320 may output a control signal Ctrl according to a communication protocol (rule) based on the digital data DD outputted from the physical layer 310. The link layer 320 of the module 3 may include, e.g., PCIe Data Link, although some embodiments are not limited thereto.

A program for the driving device 330 may be executed (e.g., triggered) by the control signal Ctrl. The driving device 330 of the module 3 may perform an arithmetic operation by the control signal Ctrl. When the module 3 that receives the first and second DC-blocked high-speed differential signals AC'_D1 and AC'_D2 is a graphics processing unit (GPU), the arithmetic operation and the like may be performed. When the module 3 is a modem chip or a CPU, the arithmetic operation or a request operation may be performed. When the module 3 is a storage device, erase, read, and/or write operations may be performed.

The high-speed signal channel 30 may include the first and second high-speed data lines 30_1 and 30_2, and transmit the first and second high-speed differential signals AC_D1 and AC_D2 between the host 2 and the module 3. The interface may include PCI express (PCIe), serial attached small computer system interface (SCSI) (SAS), serial advanced technology attachment (SATA), a universal serial bus (USB), and the like, but some embodiments of the present disclosure is not limited to the above examples.

Figure 4:
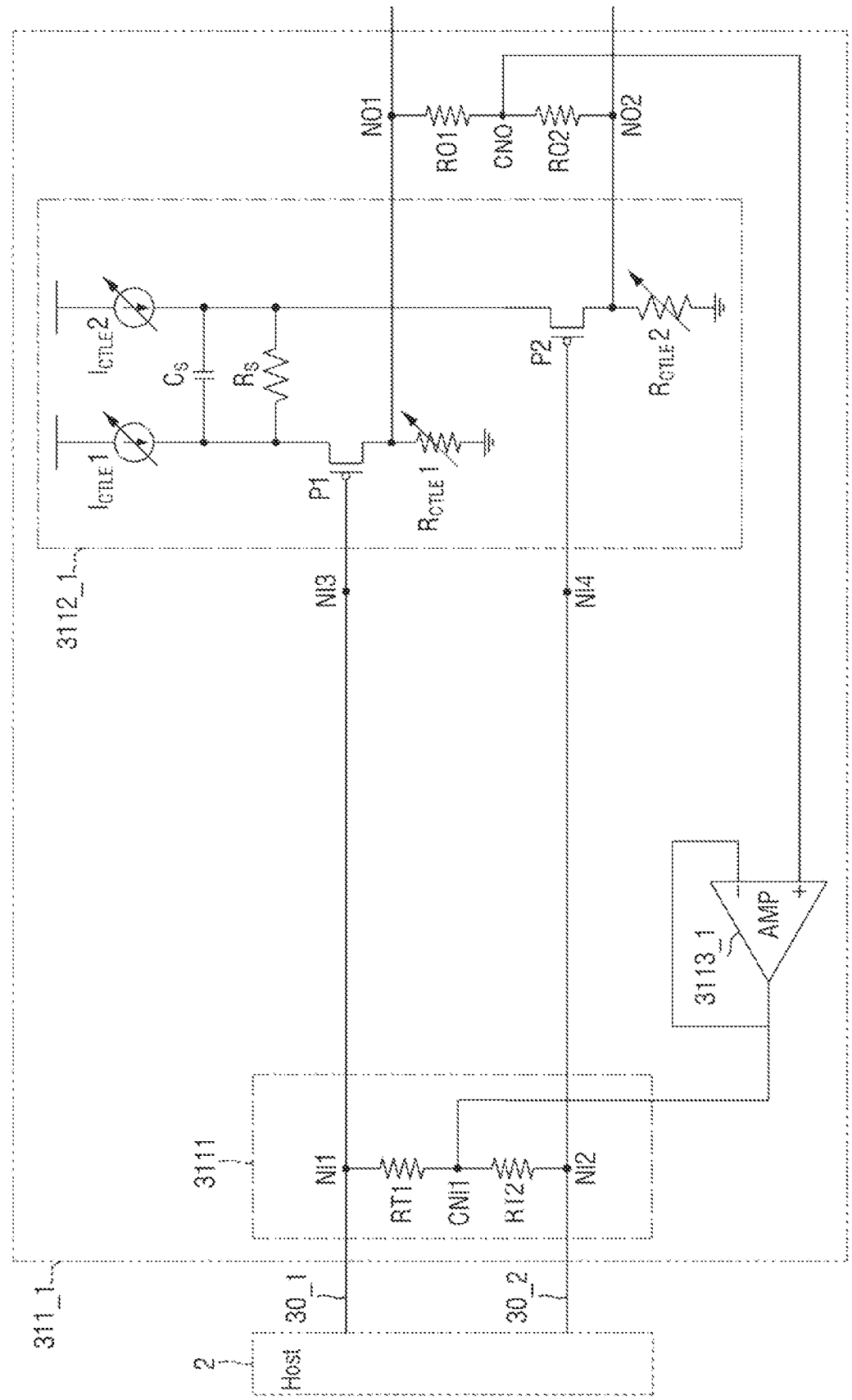
FIG. 4 is a circuit diagram illustrating the analog front-end receiver according to some embodiments of the present disclosure.

FIG. 4 is a circuit diagram illustrating the analog front-end receiver 311_1 according to some embodiments of the present disclosure.

Referring to FIG. 4, the analog front-end receiver 311_1 includes a termination resistor 3111, an active equalizer 3112_1, a common mode voltage generator 3113_1, and/or first and second output resistors RO1 and RO2.

The termination resistor 3111 may include a first termination resistor RT1 and a second termination resistor RT2. The first termination resistor RT1 may be connected to the first high-speed data line 30_1 via a first input node NI1, and the second termination resistor RT2 may be connected to the second high-speed data line 30_2 via a second input node NI2. A first input center node CNI1 may be disposed between the first and second termination resistors RT1 and RT2, and the termination resistor 3111 may be connected to the common mode voltage generator 3113_1 via the first input center node CNI1.

In some embodiments, the resistances of the first and second termination resistors RT1 and RT2 may be the same or similar.

The active equalizer 3112_1 may be connected to the termination resistor 3111 via a third input node NI3 and a fourth input node NI4. In some embodiments, the first and third input nodes NI1 and NI3 may form the same node or similar nodes, and the second and fourth input nodes NI2 and NI4 may form the same node or similar nodes.

The active equalizer 3112_1 may receive differential signals, perform the function of a high pass filter because it is capable of removing, reducing or compensating for the channel distortion such as ISI, and filter noise received from the channel, thereby outputting output differential signals.

The active equalizer 3112_1 may include a first P-type transistor P1, a second P-type transistor P2, a filter resistor Rs, a filter capacitor Cs, a first active equalization current source ICTLE1, a second active equalization current source ICTLE2, a first active equalization resistor RCTLE1, and/or a second active equalization resistor RCTLE2.

The gate of the first P-type transistor P1 may be connected to the third input node NI3, and the source of the first P-type transistor P1 may be connected to one end of the filter capacitor Cs, one end of the filter resistor Rs, and the first active equalization current source ICTLE1. The drain of the first P-type transistor P1 may be connected to a first output node NO1. In the active equalizer 3112_1 according to some embodiments, the drain of the first P-type transistor P1 may act as an output terminal.

The gate of the second P-type transistor P2 may be connected to the fourth input node NI4, and the source of the second P-type transistor P2 may be connected to one end of the filter capacitor Cs, one end of the filter resistor Rs, and the second active equalization current source ICTLE2. The drain of the second P-type transistor P2 may be connected to a second output node NO2. In the active equalizer 3112_1 according to some embodiments, the drain of the second P-type transistor P2 may act as an output terminal.

The filter capacitor Cs and the filter resistor Rs may be connected between the source of the first P-type transistor P1 and the source of the second P-type transistor P2. The filter capacitor Cs and the filter resistor Rs may be connected to each other in parallel. The filter capacitor Cs and the filter resistor Rs are elements for forming a high pass filter, and a zero point of the filter may be formed using the capacitance of the filter capacitor Cs and the resistance of the filter resistor Rs.

According to some embodiments, the first active equalization current source ICTLE1 and the second active equalization current source ICTLE2 are independent current sources. The first active equalization current source ICTLE1 may control the amount of current flowing through the first P-type transistor P1, and the second active equalization current source ICTLE2 may control the amount of current flowing through the second P-type transistor P2.

According to some embodiments, one end of the first active equalization resistor RCTLE1 is connected to the first output node NO1 and the other end thereof is grounded. According to some embodiments, one end of the second active equalization resistor RCTLE2 is connected to the second output node NO2 and the other end thereof is grounded. The first and second active equalization resistors RCTLE1 and RCTLE2 may be variable resistors, and may be resistors to which the voltages of the differential signals outputted through the first and second output nodes NO1 and NO2 are applied. Each of the first and second active equalization resistors RCTLE1 and RCTLE2 may have a resistance of 1 Kohm or less. The resistances of the first and second active equalization resistors RCTLE1 and RCTLE2 according to some embodiments may be controlled to be the same or similar.

The resistance of each of the first and second active equalization resistors RCTLE1 and RCTLE2 may be one-tenth or less of the resistance of each of the first and second output resistors RO1 and RO2, which will be described later. Thus, from the active equalizer 3112_1, the first and second output nodes NO1 and NO2 to which the first and second output resistors RO1 and RO2 are respectively connected are viewed as being opened.

One end of the first output resistor RO1 may be connected to the first output node NO1, and the other end thereof may be connected to an output center node CNO. One end of the second output resistor RO2 may be connected to the second output node NO2, and the other end thereof may be connected to the output center node CNO. The resistance of each of the first and second output resistors RO1 and RO2 may be in a range of 5 to 20 Kohm, and the resistances of the first and second output resistors RO1 and RO2 according to some embodiments are the same or similar. A common mode voltage applied to each of the first and second output resistors RO1 and RO2, which are respectively connected to the first and second P-type transistors P1 and P2 according to some embodiments, is in a range of 200 to 400 mV.

The common mode voltage generator 3113_1 may include a common mode current amplifier AMP. The common mode current amplifier AMP may output a common mode current based on the difference between the voltages inputted to a first (positive) terminal and a second (negative) terminal.

The first (positive) terminal of the common mode current amplifier AMP may be connected to the output center node CNO, and the second (negative) terminal of the common mode current amplifier AMP may be connected to the first input center node CNI1. The output terminal of the common mode current amplifier AMP according to some embodiments may also be connected to the first input center node CNI1.

The common mode current amplifier AMP according to some embodiments may provide the common mode current to the first input center node CNI1, so that the input common mode voltage of the signal inputted to each of the third and fourth input nodes NI3 and NI4 may be adjusted.

The common mode voltage generator 3113_1 according to some embodiments may adjust the input common mode voltage of the signal inputted to each of the third and fourth input nodes NI3 and NI4 to be the same as (e.g., equal to), or similar to, the output common mode voltage of the signal applied to each of the first and second output nodes NO1 and NO2, using the common mode current.

The analog front-end receiver 311_1 may adjust the input common mode voltage inputted to the active equalizer 3112_1 to be the same as, or similar to, the output common mode voltage through the feedback system including the termination resistor 3111, the active equalizer 3112_1, the first and second output resistors RO1 and RO2, and/or the common mode voltage generator 3113_1.

FIGS. 5 to 8 are drawings for explaining the operation of the analog front-end receiver 311_1 of FIG. 4.

Figure 5:
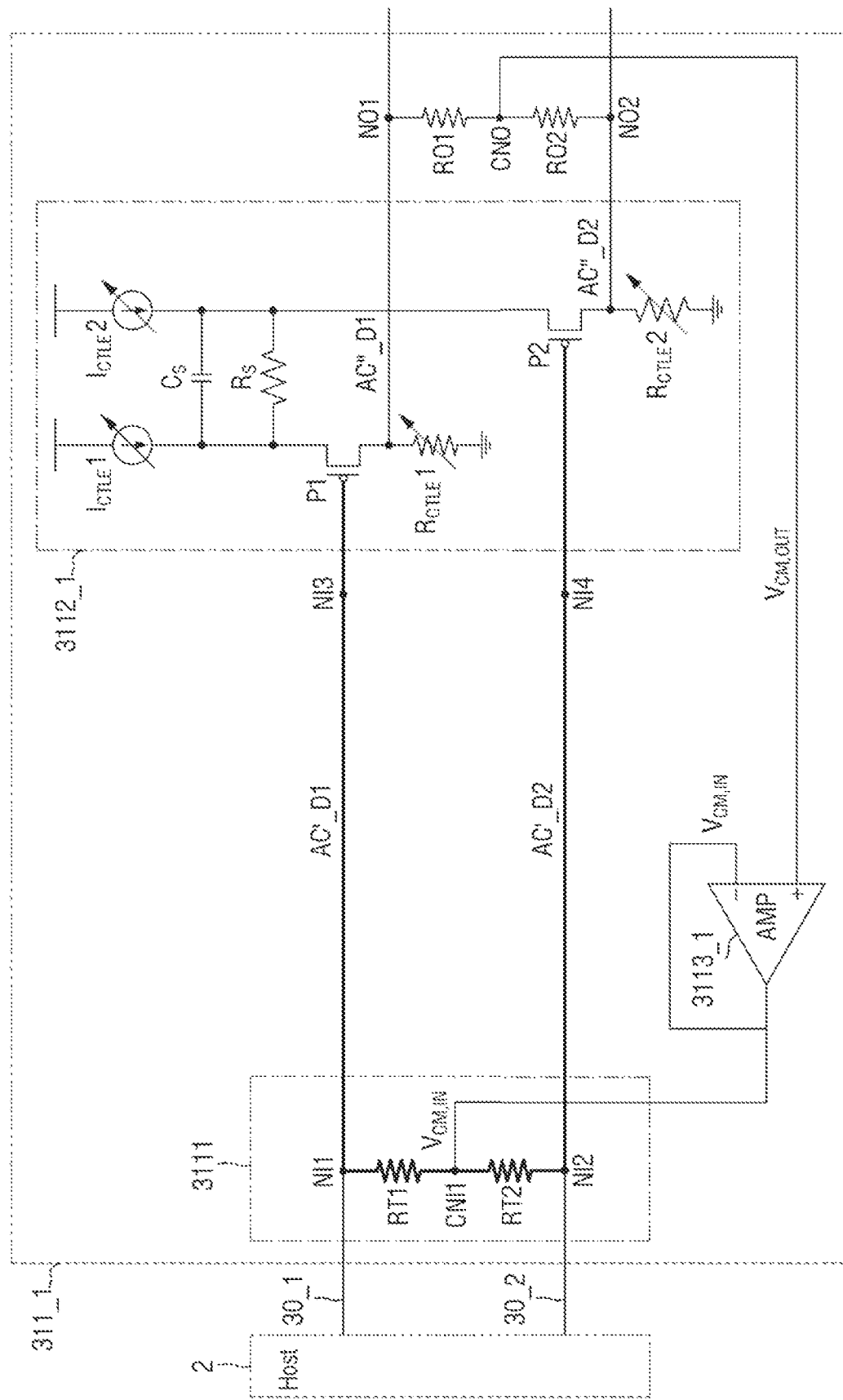
FIGS. 5 to 8 are drawings for explaining the operation of the analog front-end receiver of FIG. 4.

Referring to FIG. 5, the first DC-blocked high-speed differential signal AC'_D1 may be provided to the first input node NI1 through the first high-speed data line 30_1, and the second DC-blocked high-speed differential signal AC'_D2 may be provided to the second input node NI2 through the second high-speed data line 30_2.

In the analog front-end receiver 311_1 according to some embodiments, since the first input node NI1 and the third input node NI3 form the same node or similar nodes, the first DC-blocked high-speed differential signal AC'_D1 may be provided to the active equalizer 3112_1 through the third input node NI3.

In the analog front-end receiver 311_1 according to some embodiments, since the second input node NI2 and the fourth input node NI4 form the same node or similar nodes, the second DC-blocked high-speed differential signal AC'_D2 may be provided to the active equalizer 3112_1 through the fourth input node NI4.

In the analog front-end receiver 311_1 according to some embodiments, since the resistances of the first and second termination resistors RT1 and RT2 are the same or similar, an input common mode voltage $V_{CM,IN}$ may be generated at the first input center node CNI1. The generated input common mode voltage $V_{CM,IN}$ may be provided to the second (negative) terminal of the common mode current amplifier AMP.

Figure 6:
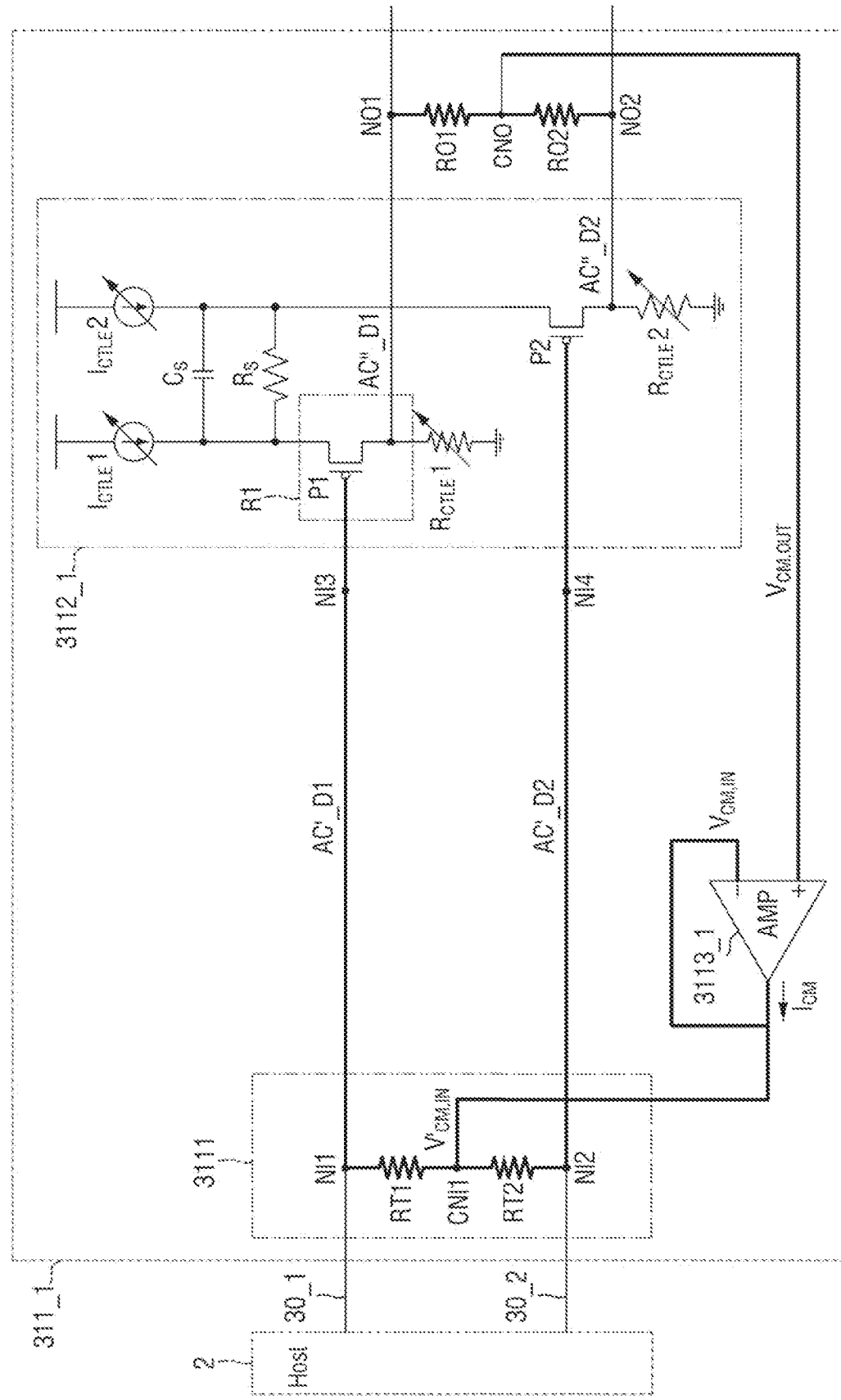

Referring to FIG. 6, based on the first DC-blocked high-speed differential signal AC'_D1 provided through the gate, the first P-type transistor P1 may output the first output differential signal AC"_D1 to the first output node NO1.

Based on the second DC-blocked high-speed differential signal AC'_D2 provided through the gate, the second P-type transistor P2 may output the second output differential signal AC"_D2 to the second output node NO2.

In the analog front-end receiver 311_1 according to some embodiments, since the resistances of the first and second output resistors RO1 and RO2 are the same or similar, an output common mode voltage $V_{CM,OUT}$ may be generated at the output center node CNO. The output common mode voltage $V_{CM,OUT}$ may be provided to, and sensed by, the first (positive) terminal of the common mode current amplifier AMP.

The common mode current amplifier AMP may output a common mode current $I_{CM}$ to the first input center node CNI1 according to the voltage difference between the output common mode voltage $V_{CM,OUT}$ inputted to the first (positive) terminal and the input common mode voltage $V_{CM,IN}$ inputted to the second (negative) terminal.

The common mode current $I_{CM}$ may provide a half of the common mode current $I_{CM}$ to each of the first and second termination resistors RT1 and RT2, and an adjusted input common mode voltage $V'_{CM,IN}$ may be included in each of the first and second DC-blocked high-speed differential signals AC'_D1 and AC'_D2 as a DC voltage component.

Therefore, the adjusted input common mode voltage $V'_{CM,IN}$, which has been adjusted by providing the common mode current $I_{CM}$, may be applied to each of the third and fourth input nodes NI3 and NI4.

Figure 7:
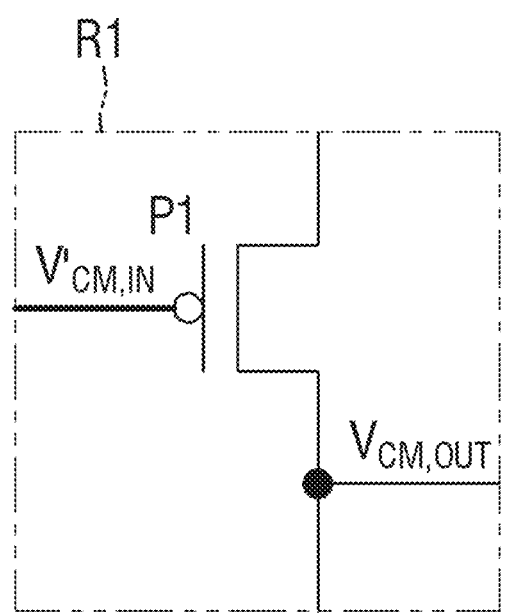
Figure 8:
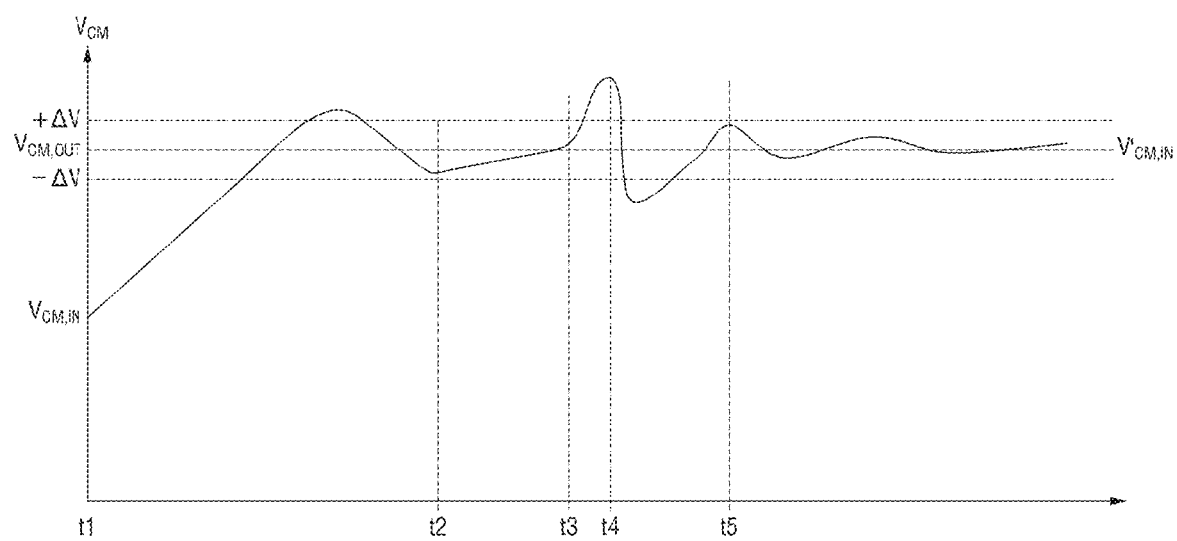

FIG. 7 is an enlarged view of area R1 of FIG. 6. FIG. 8 is a graph for explaining a common mode voltage $V_{CM}$ inputted to each of the first and second P-type transistors P1 and P2 through the third and fourth input nodes NI3 and NI4.

Referring to FIGS. 7 and 8, after the common mode current amplifier (AMP) performs the output operation of the common mode current $I_{CM}$, the adjusted input common mode voltage $V'_{CM,IN}$ may be inputted to the gate of the first P-type transistor P1, and the output common mode voltage $V_{CM,OUT}$ may be outputted from the output terminal of the first P-type transistor P1.

At first time t1, the input common mode voltage $V_{CM,IN}$ may be smaller than the output common mode voltage $V_{CM,OUT}$. The common mode current amplifier AMP may increase the input common mode voltage $V_{CM,IN}$ by increasing the amount of the common mode current $I_{CM}$.

After second time t2, the common mode current amplifier AMP may control the input common mode voltage $V_{CM,IN}$ to be maintained in a voltage range ΔV predetermined or alternatively, given based on the output common mode voltage $V_{CM,OUT}$. According to some embodiments, the common mode current amplifier AMP may maintain a voltage different between the input common mode voltage $V_{CM,IN}$ and the output common mode voltage $V_{CM,OUT}$ within a range of 10 mV.

At third time t3, the input common mode voltage $V_{CM,IN}$ may be increased due to a change in the test environment for the analog front-end receiver 311_1, a change in the operating temperature thereof, and/or the like.

At fourth time t4, the common mode current amplifier AMP may decrease the input common mode voltage $V_{CM,IN}$ by decreasing the amount of the common mode current $I_{CM}$.

After fifth time t5, the common mode current amplifier AMP may adjust the input common mode voltage $V_{CM,IN}$ to the adjusted input common mode voltage V'CM,IN, thereby controlling the adjusted input common mode voltage V'CM, IN to remain constant in the voltage range ΔV predetermined or alternatively, given based on the output common mode voltage $V_{CM,OUT}$, and controlling the input common mode voltage $V'_{CM,IN}$ and the output common mode voltage $V_{CM,OUT}$ to be the same or similar. According to some embodiments, the module 3 may perform an operation (e.g., a calculation operation, a processing operation, a communication operation, etc.) while the common module current amplifier AMP controls the adjusted input common mode voltage $V'_{CM,IN}$ to remain constant in the voltage range ΔV predetermined or alternatively, given based on the output common mode voltage $V_{CM,OUT}$, and controls the input common mode voltage $V'_{CM,IN}$ and the output common mode voltage $V_{CM,OUT}$ to be the same or similar. For example, according to some embodiments, the physical layer 310 may provide the digital data DD1 to the link layer 320 based on the first and second DC-blocked high-speed differential signals AC'_D1 and AC'_D2 while the common module current amplifier AMP controls the adjusted input common mode voltage $V'_{CM,IN}$ to remain constant in the voltage range ΔV predetermined or alternatively, given based on the output common mode voltage $V_{CM,OUT}$, and controls the input common mode voltage $V'_{CM,IN}$ and the output common mode voltage $V_{CM,OUT}$ to be the same or similar.

By controlling the input common mode voltage $V'_{CM,IN}$ and the output common mode voltage $V_{CM,OUT}$ to be the same or similar, it is possible to allow the first and second P-type transistors P1 and P2 to operate in the saturation region rather than the triode region. The first and second P-type transistors P1 and P2 may maintain the normal operation by the feedback system including the common mode current amplifier AMP.

Conventional electronic devices fail to adequately adjust electrical signals (e.g., voltage, current, etc.) input to components of the electronic devices in response to changes to operational characteristics of the components (e.g., operating temperature, etc.). Accordingly, the conventional electronic devices fail to maintain normal operation with sufficient reliability, resulting in excessive erroneous operation, delay and/or resource consumption (power, processor, memory, etc.).

However, according to some embodiments, improved devices (e.g., analog front-end receivers) that adjust electrical signals (e.g., voltage, current, etc.) input to components (e.g., transistors, etc.) of the improved devices in response to changes to operational characteristics of the components (e.g., operating temperature, etc.) are provided. For example, as discussed herein, the improved devices may control the input common mode voltage $V'_{CM,IN}$ and the output common mode voltage $V_{CM,OUT}$ to be the same or similar, thereby enabling the first and second P-type transistors P1 and P2 to operate in the saturation region rather than the triode region. Accordingly, the improved devices overcome the deficiencies of the conventional electronic devices in order to maintain normal operation with sufficient reliability, and thereby reduce the occurrence of erroneous operation, delay and/or resource consumption (power, processor, memory, etc.).

Figure 9:
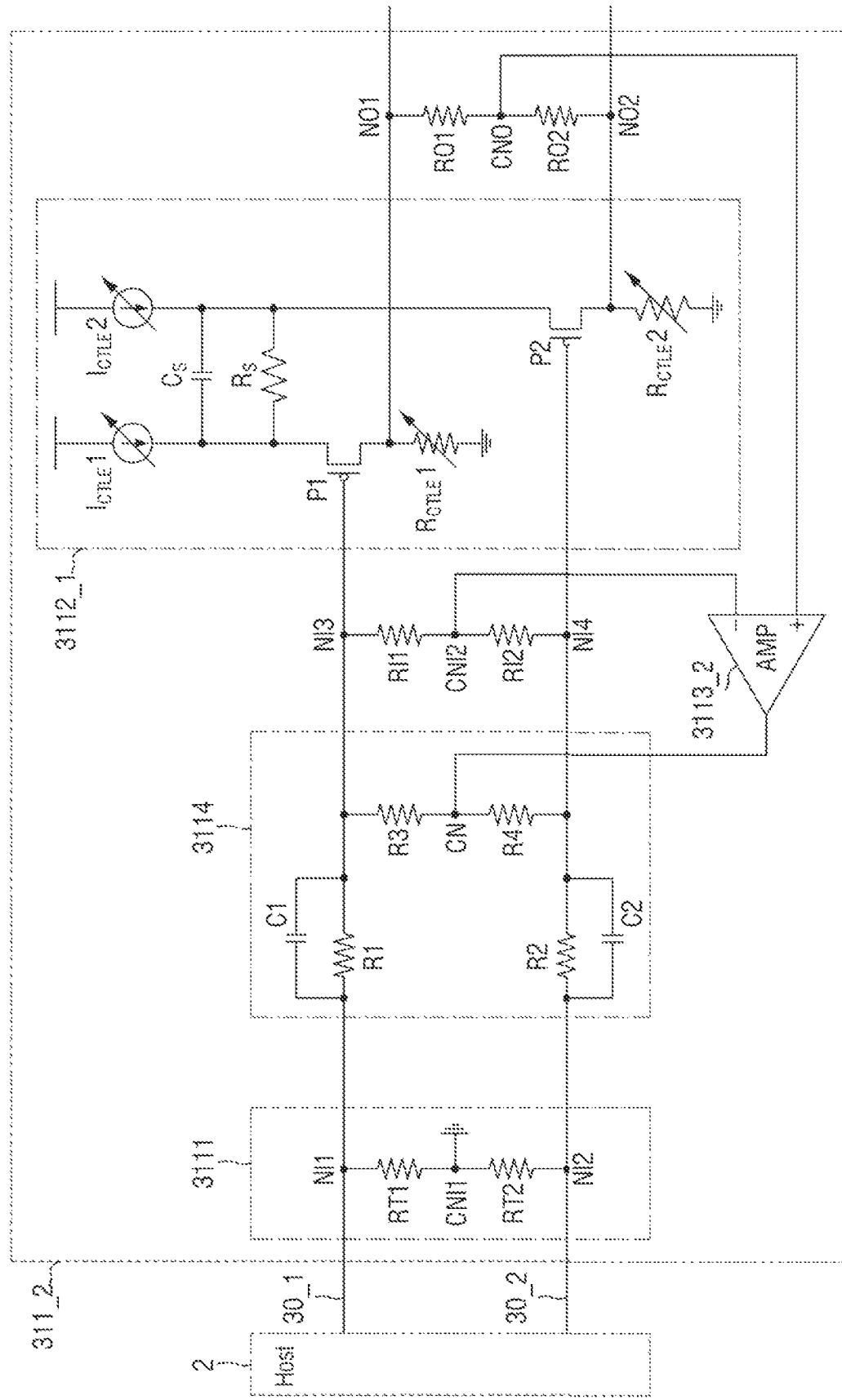
FIG. 9 is a circuit diagram illustrating an analog front-end receiver according to some embodiments of the present disclosure.

FIG. 9 is a circuit diagram illustrating an analog front-end receiver according to some embodiments of the present disclosure.

In the following, an analog front-end receiver 311_2 according to some embodiments of the present disclosure will be described with reference to FIG. 9. Differences from the analog front-end receiver 311_1 shown in FIG. 4 will be mainly described.

Compared to the front-end receiver 311_1 of FIG. 4, the analog front-end receiver 311_2 may further include a passive equalizer 3114, and first and second input resistors RI1 and RI2. The passive equalizer 3114 may be disposed between the first and third input nodes NI1 and NI3, and between the second and fourth input nodes NI2 and NI4.

The passive equalizer 3114 may include only passive elements, and perform an equalization operation of compensating for channel distortion or reducing noise on the inputted differential signals.

The passive equalizer 3114 may include first to fourth resistors R1, R2, R3, and R4, and first and second capacitors. The first resistor R1 and the first capacitor C1 may be disposed between the first and third input nodes NI1 and NI3, and may be connected to each other in parallel. The second resistor R2 and the second capacitor C2 may be disposed between the second and fourth input nodes NI2 and NI4, and may be connected to each other in parallel.

The third resistor R3 may be disposed between the third input node NI3 and a center node CN, and the fourth resistor R4 may be disposed between the fourth input node NI4 and the center node CN.

Compared to the front-end receiver 311_1 of FIG. 4, the first input center node CNI1 may be grounded, and the output terminal of the common mode voltage generator 3113_2 (e.g., the common mode current amplifier AMP) may be connected to the center node CN disposed between the third and fourth resistors R3 and R4.

The first input resistor RI1 may be disposed between a second input center node CNI2 and the third input node NI3, with the third input node NI3 being disposed between the passive equalizer 3114 and the active equalizer 3112_1. The second input resistor RI2 may be disposed between the second input center node CNI2 and the fourth input node NI4, with the fourth input node NI4 being disposed between the passive equalizer 3114 and the active equalizer 3112_1. The second (negative) terminal of the common mode current amplifier AMP may be connected to the second input center node CNI2.

Figure 10:
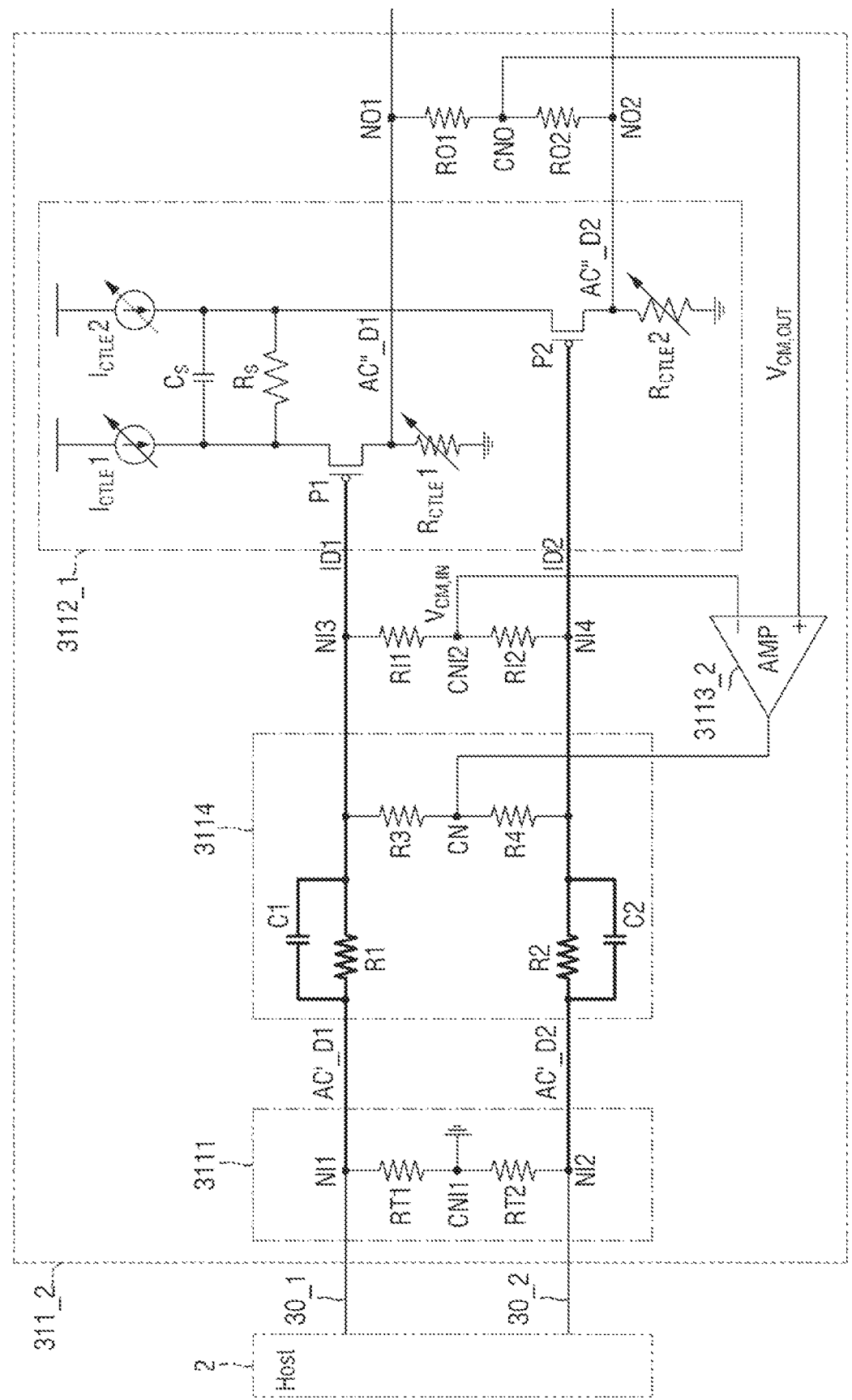
FIGS. 10 and 11 are drawings for explaining the operation of the analog front-end receiver of FIG. 9.
Figure 11:
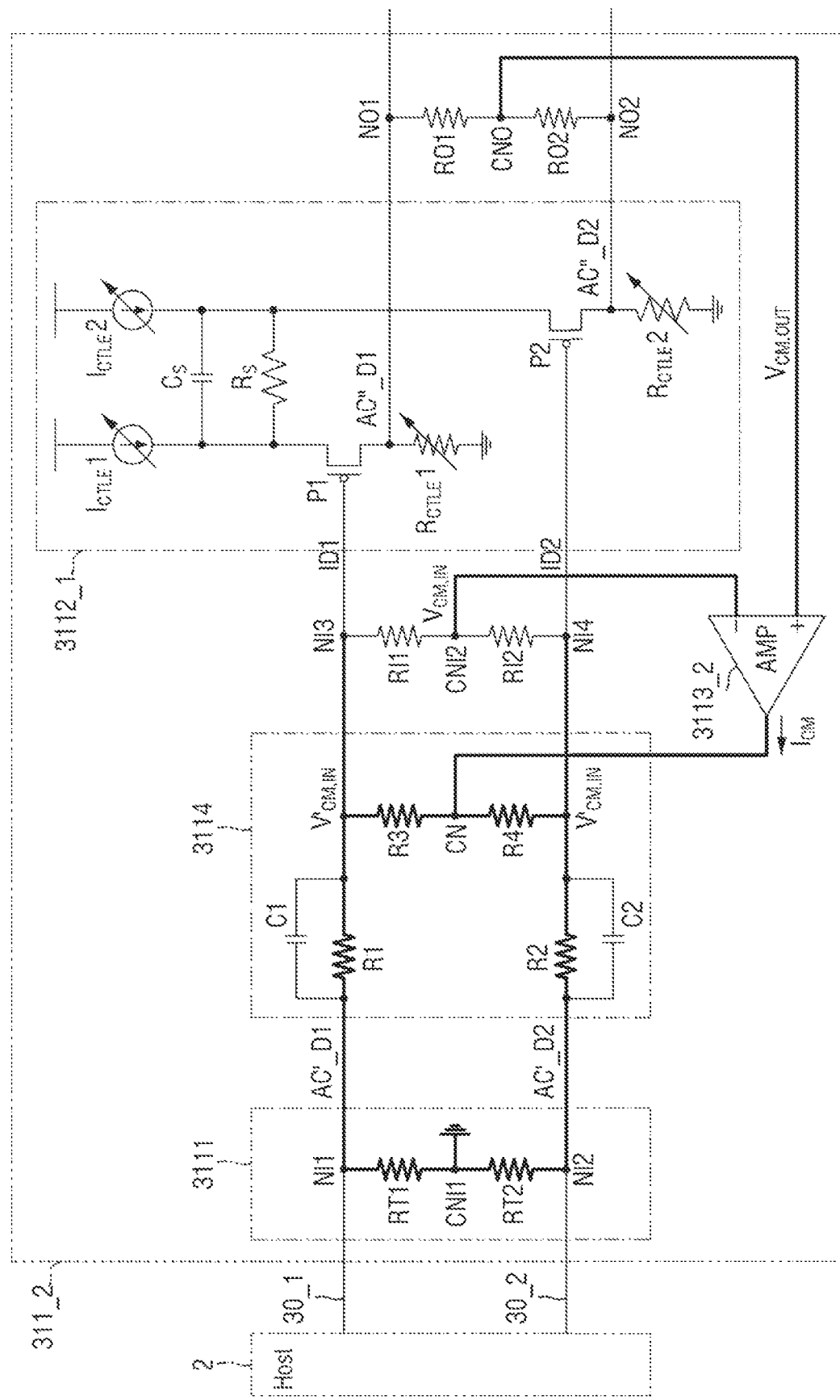

FIGS. 10 and 11 are drawings for explaining the operation of the analog front-end receiver of FIG. 9.

Referring to FIG. 10, the first DC-blocked high-speed differential signal AC'_D1 may be provided to the first input node NI1 through the first high-speed data line 30_1, and the second DC-blocked high-speed differential signal AC'_D2 may be provided to the second input node NI2 through the second high-speed data line 30_2.

The passive equalizer 3114 may equalize the first DC-blocked high-speed differential signal AC'_D1 through the first resistor R1, the third resistor R3, and the first capacitor C1 to generate a first input differential signal ID1, and provide the first input differential signal ID1 to the active equalizer 3112_1 through the third input node NI3.

The passive equalizer 3114 may equalize the second DC-blocked high-speed differential signal AC'_D2 through the second resistor R2, the fourth resistor R4, and the second capacitor C2 to generate a second input differential signal ID2, and provide the second input differential signal ID2 to the active equalizer 3112_1 through the fourth input node NI4.

In the analog front-end receiver 311_2 according to some embodiments, since the resistances of the first and second input resistors RI1 and RI2 are the same or similar, the input common mode voltage $V_{CM,IN}$ may be generated at the second input center node CNI2 disposed between the third and fourth input nodes NI3 and NI4. The generated input common mode voltage $V_{CM,IN}$ may be provided to the second (negative) terminal of the common mode current amplifier AMP.

Based on the first input differential signal ID1 provided through the gate, the first P-type transistor P1 may output the first output differential signal AC"_D1 to the first output node NO1.

Based on the second input differential signal ID2 provided through the gate, the second P-type transistor P2 may output the second output differential signal AC"_D2 to the second output node NO2.

In the analog front-end receiver 311_2 according to some embodiments, since the resistances of the first and second output resistors RO1 and RO2 are the same or similar, an output common mode voltage $V_{CM,OUT}$ may be generated at the output center node CNO. The output common mode voltage $V_{CM,OUT}$ may be provided to, and sensed by, the first (positive) terminal of the common mode current amplifier AMP.

Referring to FIG. 11, based on the first input differential signal ID1 provided through the gate, the first P-type transistor P1 may output the first output differential signal AC"_D1 to the first output node NO1.

Based on the second input differential signal ID2 provided through the gate, the second P-type transistor P2 may output the second output differential signal AC"_D2 to the second output node NO2.

In the analog front-end receiver 311_2 according to some embodiments, since the resistances of the first and second output resistors RO1 and RO2 are the same or similar, an output common mode voltage $V_{CM,OUT}$ may be generated at the output center node CNO. The output common mode voltage $V_{CM,OUT}$ may be provided to, and sensed by, the first (positive) terminal of the common mode current amplifier AMP.

The common mode current amplifier AMP may output a common mode current $I_{CM}$ to the center node CN according to the voltage difference between the output common mode voltage $V_{CM,OUT}$ inputted to the first (positive) terminal and the input common mode voltage $V_{CM,IN}$ inputted to the second (negative) terminal.

The common mode current $I_{CM}$ may provide a half of the common mode current $I_{CM}$ to each of the third and fourth resistors R3 and R4, and the adjusted input common mode voltage $V'_{CM,IN}$ may be included in each of the first and second input differential signals ID1 and ID2 as a DC voltage component.

That is, the adjusted input common mode voltage $V'_{CM,IN}$ may be generated by providing the common mode current $I_{CM}$ to the third input node NI3, and using the common mode current $I_{CM}$, the first termination resistor RT1, and the first and third resistors R1 and R3.

Further, the adjusted input common mode voltage $V'_{CM,IN}$ may be generated by providing the common mode current $I_{CM}$ to the fourth input node NI4, and using the common mode current $I_{CM}$, the second termination resistor RT2, and the second and fourth resistors R2 and R4.

Figure 12:
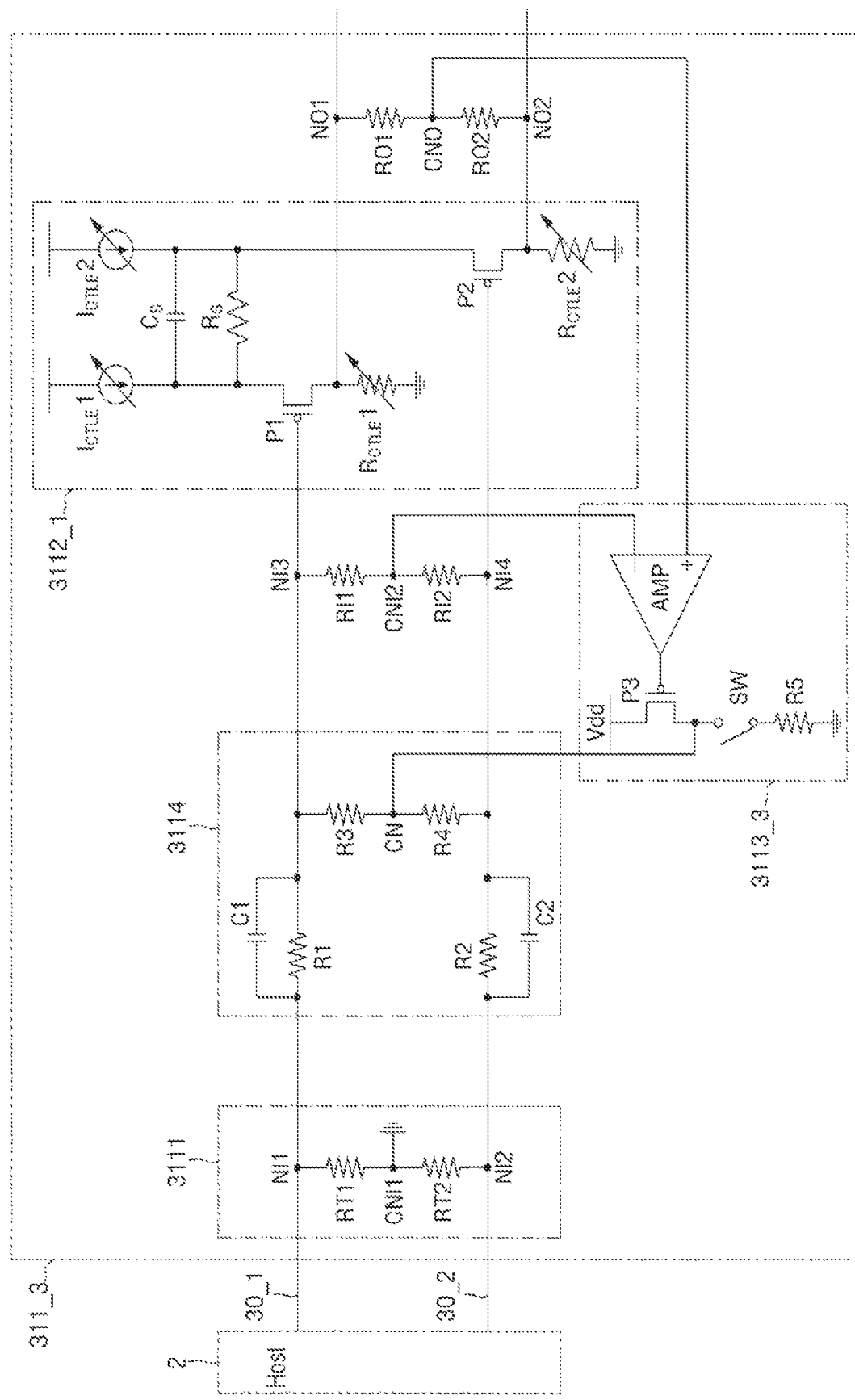
FIG. 12 is a circuit diagram illustrating an analog front-end receiver according to some embodiments of the present disclosure.

FIG. 12 is a circuit diagram illustrating an analog front-end receiver according to some embodiments of the present disclosure.

In the following, an analog front-end receiver 311_3 according to some embodiments of the present disclosure will be described with reference to FIG. 12. Differences from the analog front-end receiver 311_2 shown in FIG. 9 will be mainly described.

Compared to the analog front-end receiver 311_2 of FIG. 9, a common mode voltage generator 3113_3 according to some embodiments may further include a third P-type transistor P3, a switch SW, and/or a fifth resistor R5.

The gate of the third P-type transistor P3 may be connected to the output terminal of the common mode current amplifier AMP, and the output terminal of the third P-type transistor P3 may be connected to the center node CN of the passive equalizer 3114. Further, the output terminal of the third P-type transistor P3 may be connected to the fifth resistor R5, of which one end is grounded, via the switch SW. A power supply voltage Vdd may be connected to the drain of the third P-type transistor P3.

Figure 13:
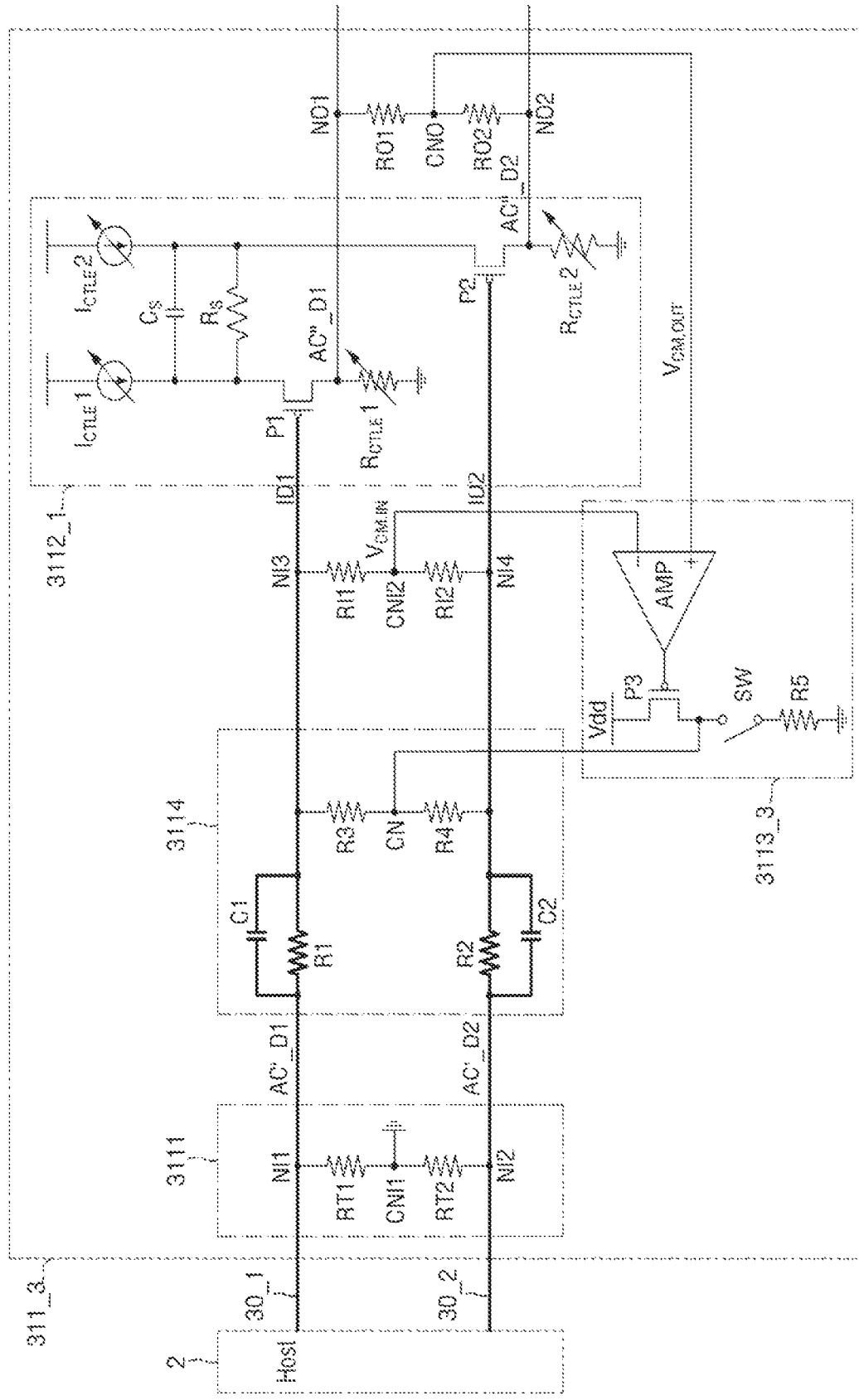
FIGS. 13 and 14 are drawings for explaining the operation of the analog front-end receiver of FIG. 12.
Figure 14:
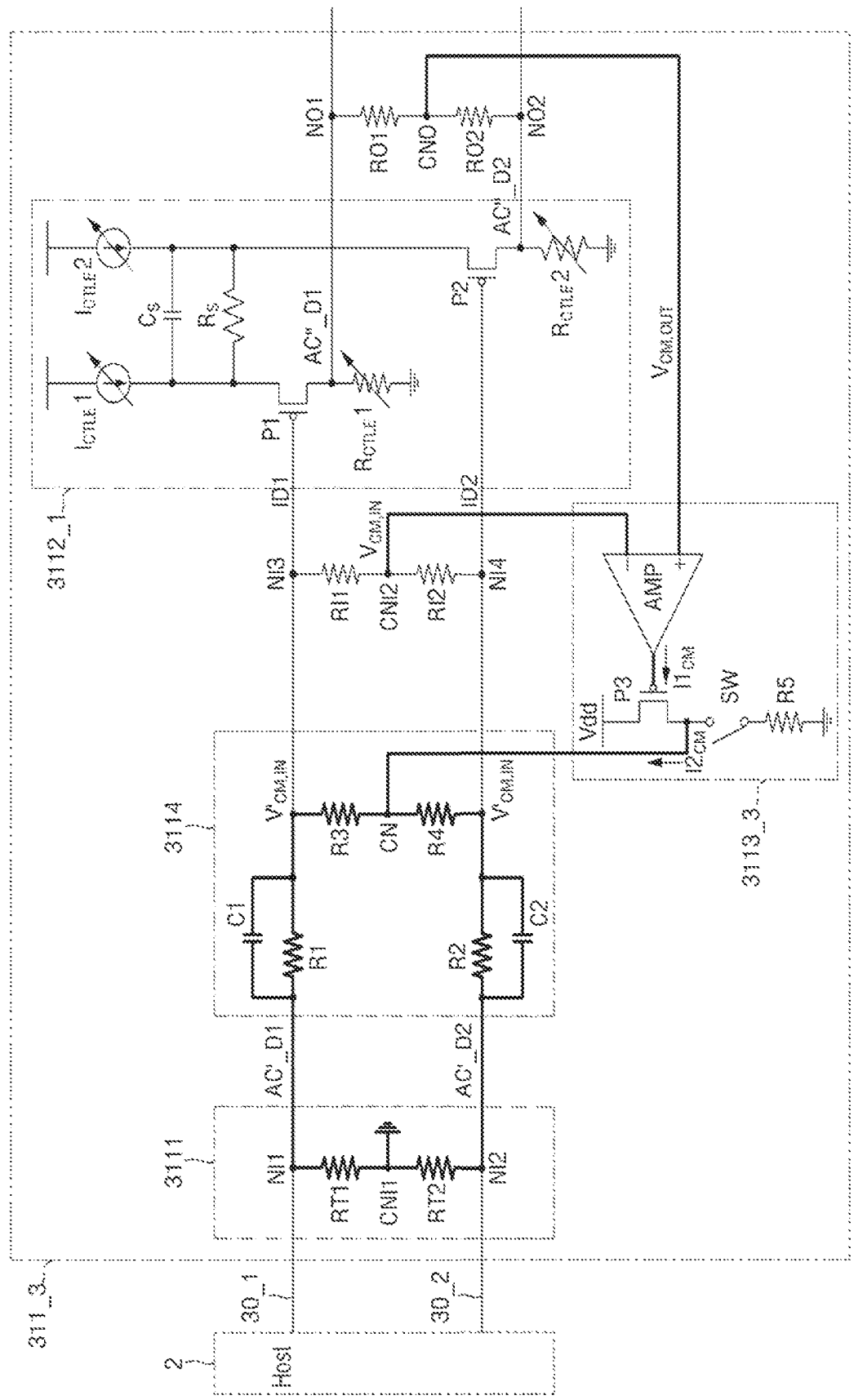

FIGS. 13 and 14 are drawings for explaining the operation of the analog front-end receiver of FIG. 12.

Referring to FIG. 13, the first DC-blocked high-speed differential signal AC'_D1 may be provided to the first input node NI1 through the first high-speed data line 30_1, and the second DC-blocked high-speed differential signal AC'_D2 may be provided to the second input node NI2 through the second high-speed data line 30_2.

The passive equalizer 3114 may equalize the first DC-blocked high-speed differential signal AC'_D1 through the first resistor R1, the third resistor R3, and the first capacitor C1 to generate a first input differential signal ID1, and provide the first input differential signal ID1 to the active equalizer 3112_1 through the third input node NI3.

The passive equalizer 3114 may equalize the second DC-blocked high-speed differential signal AC'_D2 through the second resistor R2, the fourth resistor R4, and the second capacitor C2 to generate a second input differential signal ID2, and provide the second input differential signal ID2 to the active equalizer 3112_1 through the fourth input node NI4.

In the analog front-end receiver 311_3 according to some embodiments, since the resistances of the first and second input resistors RI1 and RI2 are the same or similar, the input common mode voltage $V_{CM,IN}$ may be generated at the second input center node CNI2 disposed between the third and fourth input nodes NI3 and NI4. The generated input common mode voltage $V_{CM,IN}$ may be provided to the second (negative) terminal of the common mode current amplifier AMP.

Based on the first input differential signal ID1 provided through the gate, the first P-type transistor P1 may output the first output differential signal AC"_D1 to the first output node NO1.

Based on the second input differential signal ID2 provided through the gate, the second P-type transistor P2 may output the second output differential signal AC"_D2 to the second output node NO2.

In the analog front-end receiver 311_3 according to some embodiments, since the resistances of the first and second output resistors RO1 and RO2 are the same or similar, an output common mode voltage $V_{CM,OUT}$ may be generated at the output center node CNO. The output common mode voltage $V_{CM,OUT}$ may be provided to and sensed by the first (positive) terminal of the common mode current amplifier AMP.

Referring to FIG. 14, based on the first input differential signal ID1 provided through the gate, the first P-type transistor P1 may output the first output differential signal AC"_D1 to the first output node NO1.

Based on the second input differential signal ID2 provided through the gate, the second P-type transistor P2 may output the second output differential signal AC"_D2 to the second output node NO2.

In the analog front-end receiver 311_3 according to some embodiments, since the resistances of the first and second output resistors RO1 and RO2 are the same or similar, an output common mode voltage $V_{CM,OUT}$ may be generated at the output center node CNO. The output common mode voltage $V_{CM,OUT}$ may be provided to and sensed by the first (positive) terminal of the common mode current amplifier AMP.

The common mode current amplifier AMP may output a first common mode current $I1_{CM}$ according to the voltage difference between the output common mode voltage $V_{CM,OUT}$ inputted to the first (positive) terminal and the input common mode voltage $V_{CM,IN}$ inputted to the second (negative) terminal.

The first common mode current $I1_{CM}$ is inputted to the gate of the third P-type transistor P3, and the switch SW may be opened. The third P-type transistor P3 may output a second common mode current $I2_{CM}$ from the power supply voltage Vdd, through the output terminal.

The second common mode current $I2_{CM}$ may provide a half of the second common mode current $I2_{CM}$ to each of the third and fourth resistors R3 and R4, and the adjusted input common mode voltage $V'_{CM,IN}$ may be included in each of the first and second input differential signals ID1 and ID2 as a DC voltage component.

That is, the adjusted input common mode voltage $V'_{CM,IN}$ may be generated by providing the second common mode current $I2_{CM}$ to the third input node NI3, and using the second common mode current $I2_{CM}$, the first termination resistor RT1, and the first and third resistors R1 and R3.

Further, the adjusted input common mode voltage $V'_{CM,IN}$ may be generated by providing the second common mode current $I2_{CM}$ to the fourth input node NI4, and using the second common mode current $I2_{CM}$, the second termination resistor RT2, and the second and fourth resistors R2 and R4.

The adjusted input common mode voltage $V'_{CM,IN}$ may be generated according to Eq. 1 below.

$$V'_{CM,IN} = (RT1 + R1 + R3)(I2_{CM}/2) \qquad \text{Eq. 1}$$

According to some embodiments, since the first termination resistor RT1, the first resistor R1, and the third resistor R3 may be the same as, or similar to, the second termination resistor RT2, the second resistor R2, and the fourth resistor R4, respectively, the adjusted input common mode voltage $V'_{CM,IN}$ generated using the second common mode current $I2_{CM}$, the second termination resistor RT2, and the second and fourth resistors R2 and R4 may also be the same as, or similar to, Eq. 1.

Figure 15:
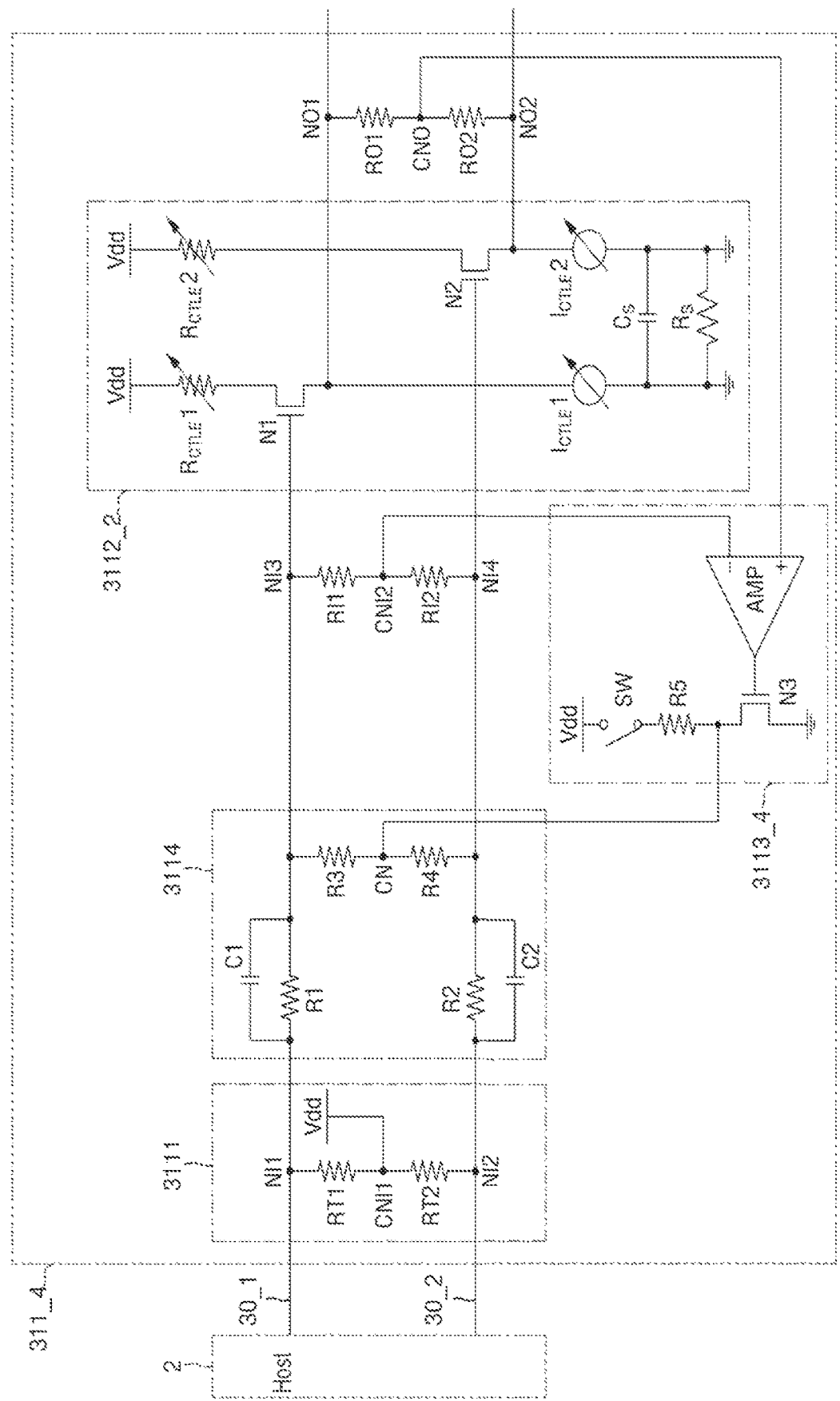
FIG. 15 is a circuit diagram illustrating an analog front-end receiver according to some embodiments of the present disclosure.

FIG. 15 is a circuit diagram illustrating an analog front-end receiver according to some embodiments of the present disclosure.

Hereinafter, an analog front-end receiver 311_4 according to some embodiments of the present disclosure will be described with reference to FIG. 15. Differences from the analog front-end receivers 311_3 shown in FIG. 12 will be mainly described.

Compared to the analog front-end receiver 311_3 of FIG. 12, the first input center node CNI1 of the termination resistor 3111 may be connected to the power supply voltage Vdd without being grounded, and an active equalizer 3112_2 may include first and second N-type transistors N1 and N2 instead of the first and second P-type transistors P1 and P2.

The gate of the first N-type transistor N1 may be connected to the third input node NI3, and the source of the first N-type transistor N1 may be connected to the first active equalization resistor RCTLE1. The gate of the second N-type transistor N2 may be connected to the fourth input node NI4, and the source of the second N-type transistor N2 may be connected to the second active equalization resistor $R_{CTLE}2$.

One end of the first active equalization resistor $R_{CTLE}1$ according to some embodiments is connected to the source of the first N-type transistor N1, and the other end thereof is connected to the power supply voltage Vdd. One end of the second active equalization resistor $R_{CTLE}2$ according to some embodiments is connected to the source of the second N-type transistor N2, and the other end thereof is connected to the power supply voltage Vdd. Each of the first and second active equalization resistors $R_{CTLE}1$ and $R_{CTLE}2$ is a resistor capable of controlling the amount of current flowing through each of the first and second N-type transistors N1 and N2. The resistance of each of the first and second active equalization resistors $R_{CTLE}1$ and $R_{CTLE}2$ may be 1 Kohm or less, and the resistances of the first and second active equalization resistors $R_{CTLE}1$ and $R_{CTLE}2$ according to some embodiments may be controlled to be the same or similar.

The drain of the first N-type transistor N1 may be connected to one end of the first active equalization current source $I_{CTLE}1$ via the first output node NO1. The drain of the second N-type transistor N2 may be connected to one end of the second active equalization current source $I_{CTLE}2$ via the second output node NO2. A common mode voltage applied to the first and second output resistors RO1 and RO2, which are respectively connected to the first and second N-type transistors N1 and N2 according to some embodiments, is in a range of 500 to 800 mV.

The filter capacitor Cs and the filter resistor Rs may be disposed between the other ends of the first and second active equalization current sources $I_{CTLE}1$ and $I_{CTLE}2$, and may be connected to each other in parallel. Both ends of each of the filter capacitor Cs and the filter resistor Rs are grounded, and the other ends of the first and second active equalization current sources $I_{CTLE}1$ and $I_{CTLE}2$ are also grounded.

The filter capacitor Cs and the filter resistor Rs are elements for forming a high pass filter, and a zero point of the filter may be formed using the capacitance of the filter capacitor Cs and the resistance of the filter resistor Rs.

Compared to the common mode voltage generator 3113_3 of FIG. 12, a common mode voltage generator 3113_4 according to some embodiments may include a third N-type transistor N3 instead of the third P-type transistor P3.

The gate of the third N-type transistor N3 may be connected to the output terminal of the common mode current amplifier AMP, and the output terminal of the third N-type transistor N3 may be connected to the center node CN of the passive equalizer 3114. In addition, the output terminal of the third N-type transistor N3 may be connected to the fifth resistor R5. The fifth resistor R5 may be connected to the power supply voltage Vdd via the switch SW.

Figure 16:
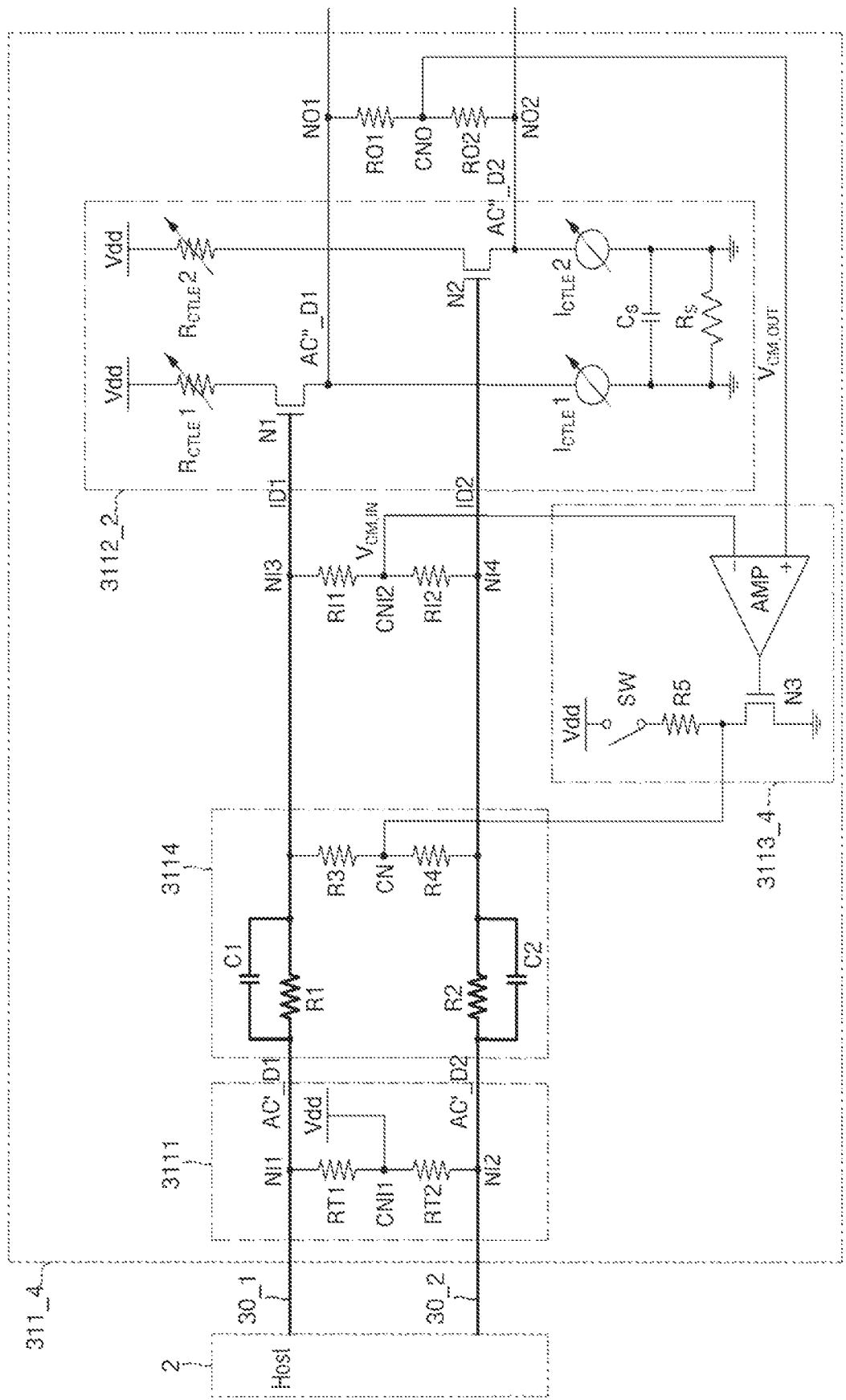
FIGS. 16 and 17 are drawings for explaining the operation of the analog front-end receiver of FIG. 15.
Figure 17:
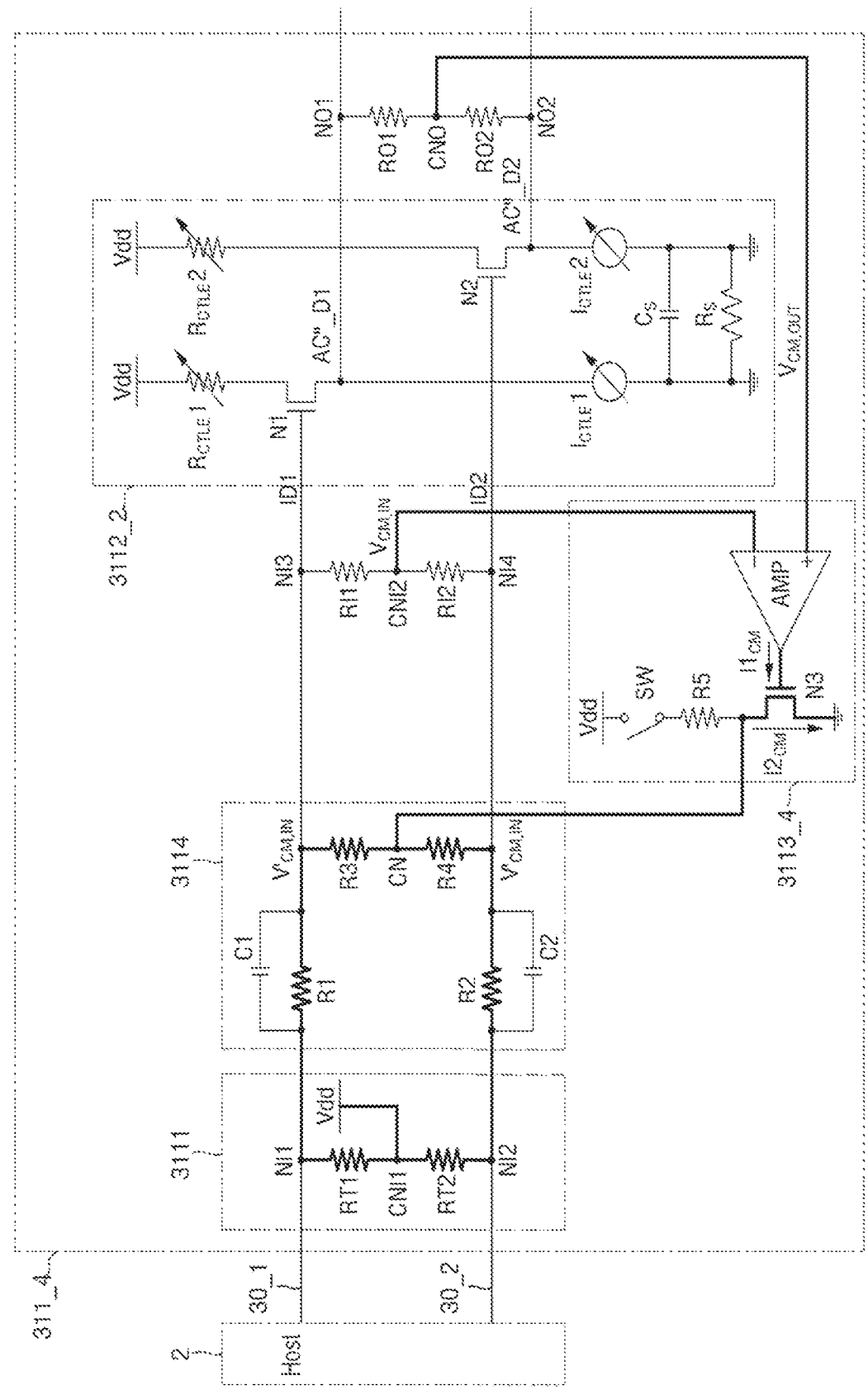

FIGS. 16 and 17 are drawings for explaining the operation of the analog front-end receiver of FIG. 15.

Referring to FIG. 16, the first DC-blocked high-speed differential signal AC'_D1 may be provided to the first input node NI1 through the first high-speed data line 30_1, and the second DC-blocked high-speed differential signal AC'_D2 may be provided to the second input node NI2 through the second high-speed data line 30_2.

The passive equalizer 3114 may equalize the first DC-blocked high-speed differential signal AC'_D1 through the first resistor R1, the third resistor R3, and the first capacitor C1 to generate a first input differential signal ID1, and provide the first input differential signal ID1 to the active equalizer 3112_2 through the third input node NI3.

The passive equalizer 3114 may equalize the second DC-blocked high-speed differential signal AC'_D2 through the second resistor R2, the fourth resistor R4, and the second capacitor C2 to generate a second input differential signal ID2, and provide the second input differential signal ID2 to the active equalizer 3112_2 through the fourth input node NI4.

In the analog front-end receiver 311_4 according to some embodiments, since the resistances of the first and second input resistors RI1 and RI2 are the same or similar, the input common mode voltage $V_{CM,IN}$ may be generated at the second input center node CNI2 disposed between the third and fourth input nodes NI3 and NI4. The generated input common mode voltage $V_{CM,IN}$ may be provided to the second (negative) terminal of the common mode current amplifier AMP.

Based on the first input differential signal ID1 provided through the gate, the first N-type transistor N1 may output the first output differential signal AC"_D1 to the first output node NO1.

Based on the second input differential signal ID2 provided through the gate, the second N-type transistor N2 may output the second output differential signal AC"_D2 to the second output node NO2.

In the analog front-end receiver 311_4 according to some embodiments, since the resistances of the first and second output resistors RO1 and RO2 are the same or similar, an output common mode voltage $V_{CM,OUT}$ may be generated at the output center node CNO. The output common mode voltage $V_{CM,OUT}$ may be provided to and sensed by the first (positive) terminal of the common mode current amplifier AMP.

Referring to FIG. 17, based on the first input differential signal ID1 provided through the gate, the first N-type transistor N1 may output the first output differential signal AC"_D1 to the first output node NO1.

Based on the second input differential signal ID2 provided through the gate, the second N-type transistor N2 may output the second output differential signal AC"_D2 to the second output node NO2.

In the analog front-end receiver 311_4 according to some embodiments, since the resistances of the first and second output resistors RO1 and RO2 are the same or similar, an output common mode voltage $V_{CM,OUT}$ may be generated at the output center node CNO. The output common mode voltage $V_{CM,OUT}$ may be provided to and sensed by the first (positive) terminal of the common mode current amplifier AMP.

The common mode current amplifier AMP may output a first common mode current $I1_{CM}$ to the third N-type transistor N3 according to the voltage difference between the output common mode voltage $V_{CM,OUT}$ inputted to the first (positive) terminal and the input common mode voltage $V_{CM,IN}$ inputted to the second (negative) terminal.

The first common mode current $I1_{CM}$ is inputted to the gate of the third N-type transistor N3, and the switch SW may be opened. The third N-type transistor N3 may provide the second common mode current $I2_{CM}$, which passes through the third and fourth input nodes NI3 and NI4 and the center node CN from the power supply voltage Vdd connected to the first input center node CNI1, to the ground terminal thereof.

The second common mode current $I2_{CM}$ may provide a half of the second common mode current $I2_{CM}$ to each of the third and fourth resistors R3 and R4, and the adjusted input common mode voltage $V'_{CM,IN}$ may be included in each of the first and second input differential signals ID1 and ID2 as a DC voltage component.

Accordingly, the adjusted input common mode voltage $V'_{CM,IN}$ may be generated by providing the second common mode current $I2_{CM}$ to the third input node NI3, and using the second common mode current $I2_{CM}$, the first termination resistor RT1, and the first and third resistors R1 and R3.

Further, the adjusted input common mode voltage $V'_{CM,IN}$ may be generated by providing the second common mode current $I2_{CM}$ to the fourth input node NI4, and using the second common mode current $I2_{CM}$, the second termination resistor RT2, and the second and fourth resistors R2 and R4.

The adjusted input common mode voltage $V'_{CM,IN}$ (e.g., the adjusted input common mode voltage $V'_{CM,IN}$ generated using the second common mode current $I2_{CM}$, the first termination resistor RT1, and the first and third resistors R1 and R3) may be generated according to Eq. 2 below.

$$V'_{CM,IN} = Vdd - (RT1 + R1 + R3)(I2_{CM}/2) \qquad \text{Eq. 2}$$

According to some embodiments, since the first termination resistor RT1, the first resistor R1, and the third resistor R3 may be the same as, or similar to, the second termination resistor RT2, the second resistor R2, and the fourth resistor R4, respectively, the adjusted input common mode voltage $V'_{CM,IN}$ generated using the second common mode current $I2_{CM}$, the second termination resistor RT2, and the second and fourth resistors R2 and R4 may be the same as or similar to Eq. 2. The N-type transistor uses a higher common mode voltage compared to the P-type transistor and thus, the analog front-end receiver 311_4 may newly define the common mode voltage in a different manner from the analog front-end receiver 311_3 of FIG. 12.

In the present disclosure, the common mode current $I_{CM}$ outputted from the common mode voltage generator 3113_1 is adjusted, thereby adjusting the input common mode voltage $V_{CM,IN}$ of the differential signal inputted to the active equalizer 3112. Accordingly, the operational performance of the equalizer 3112 may be improved, which results in increasing the operational efficiency of the analog front-end receiver 311.

Figure 18:
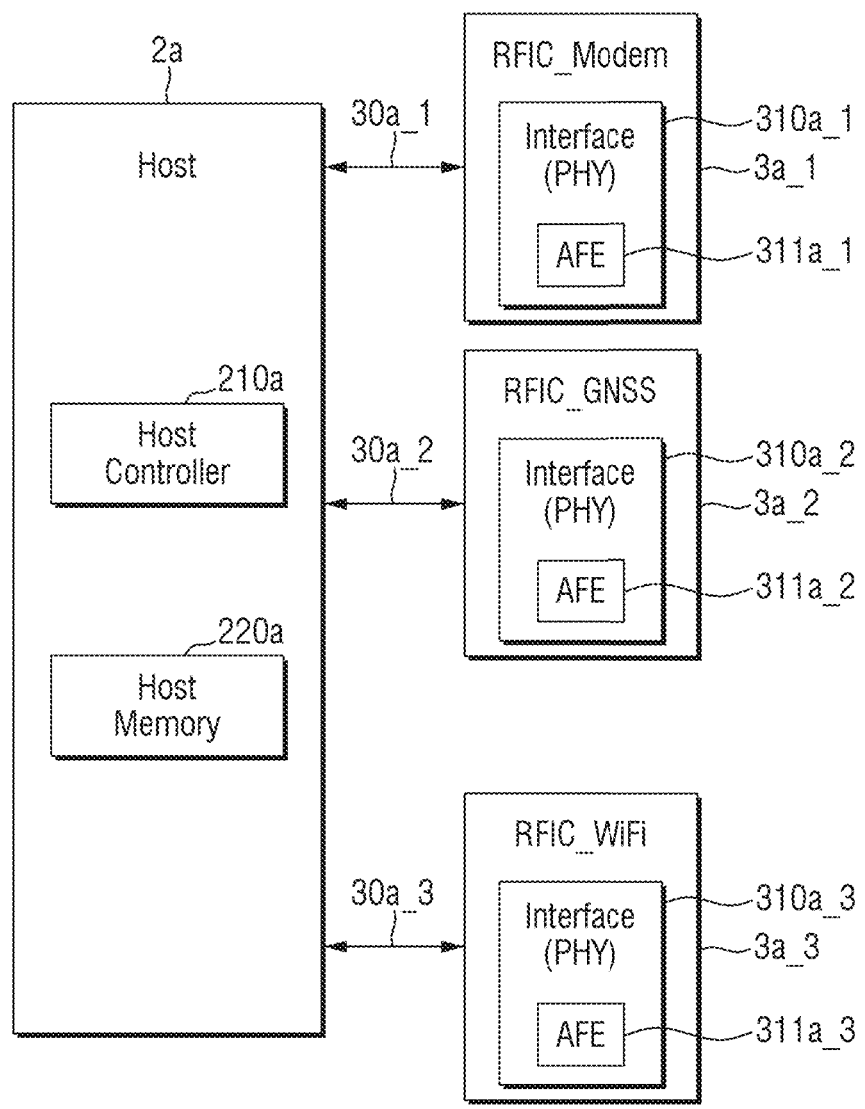
FIG. 18 is a block diagram illustrating an electronic device including a host communication module according to some embodiments of the present disclosure.

FIG. 18 is a block diagram illustrating an electronic device including a host communication module according to some embodiments of the present disclosure.

A host communication module electronic system 1a may include a host 2a, and/or first to third radio frequency (RF) chips 3a_1 to 3a_3. Further, the first to third RF chips 3a_1 to 3a_3 may include interfaces 310a_1 to 310a_3 that respectively have analog front-end receivers 311a_1 to 311a_3 corresponding to the analog front-end receiver 311 of FIGS. 1 to 17.

Further, according to some embodiments of the present disclosure, the host 2a may include a host controller 210a and/or a host memory 220a. The host memory 220a may function as a buffer memory for temporarily storing data to be transmitted to the first to third RF chips 3a_1 to 3a_3 or data that has been transmitted from the first to third RF chips 3a_1 to 3a3.

Although three communication chips are illustrated in the electronic system 1a, various types of communication chips may be further disposed. FIG. 18 illustrates the first RF chip (or RFIC_Modem) 3a_1 that processes, for example, high-speed signals relating to a modem function, the second RF chip (or RFIC_GNSS) 3a_2 that processes, for example, high-speed signals relating to a GNSS function, the third RF chip (or RFIC_WiFi) 3a_3 that processes, for example, high-speed signals relating to a WiFi function, and the like. The first to third RF chips 3a_1, 3a_2, and 3a_3 may be connected to the host 2a through first to third high-speed channels 30a_1, 30a_2, and 30a_3, respectively. The first to third high-speed channels 30a_1 to 30a_3 may provide PCI express (PCIe), serial attached SCSI (SAS), serial ATA (SATA), a universal serial bus (USB), and/or the like, but some embodiments are not limited thereto.

As described above, when the electronic system 1a supports various other types of communication functions, it may further include different types of RF chips from the types of RF chips shown in FIG. 18.

According to some example embodiments, operations described herein as being performed by the electronic system 1, the host 2, the module 3, the physical layer 310, the link layer 320, the driving device 330, the analog front-end receiver 311, the decision feedback equalizer 312, the clock-data recovery 313, the host communication module electronic system 1a, the host 2a, the first to third RF chips 3a_1 to 3a_3, the interfaces 310a_1 to 310a_3, the analog front-end receivers 311a_1 to 311a_3 and/or the host controller 210a may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The various operations of methods described above may be performed by any suitable device capable of performing the operations, such as the processing circuitry discussed above. For example, as discussed above, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with some example embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

It will be understood that when an element is referred to as being "connected" or "coupled" to another element, it can be directly connected or coupled to the other element or intervening elements may be present. As used herein the term "and/or" includes any and all combinations of one or more of the associated listed items.

However, the effects of some embodiments are not restricted to the one set forth herein. The above and other effects of some embodiments will become more apparent to one of ordinary skill in the art to which the present disclosure pertains by referencing the claims.

What is claimed is:

1. An analog front-end receiver comprising:
    a termination resistor configured to receive a first differential signal and a second differential signal from different data lines, the second differential signal being differential with respect to the first differential signal;
    an active equalizer configured to,
        receive a first input differential signal through a first input node and a second input differential signal through a second input node, the first input differential signal and the second input differential signal both having an input common mode voltage, the first input differential signal being based on the first differential signal, and the second input differential signal being based on the second differential signal, and
        output a first output differential signal to a first output node and a second output differential signal to a second output node, the second output differential signal being differential with respect to the first output differential signal; and
    an input common mode voltage generator configured to adjust the input common mode voltage to be equal to an output common mode voltage of the first output differential signal.

2. The analog front-end receiver of claim 1, wherein one end of the termination resistor is directly connected to the first input node, and another end of the termination resistor is directly connected to the second input node.

3. The analog front-end receiver of claim 2, wherein
the termination resistor comprises a first termination resistor and a second termination resistor, the first termination resistor being between the first input node and a first input center node, and the second termination resistor being between the second input node and the first input center node; and
the input common mode voltage generator is configured to adjust the input common mode voltage to be equal to the output common mode voltage by providing a common mode current to the first input center node.

4. The analog front-end receiver of claim 1, further comprising:
a passive equalizer configured to equalize the first differential signal and the second differential signal to obtain the first input differential signal and the second input differential signal.

5. The analog front-end receiver of claim 4, wherein
the passive equalizer comprises a first resistor and a second resistor, the first resistor being between the first input node and a center node, and the second resistor being between the second input node and the center node; and
the input common mode voltage generator is configured to adjust the input common mode voltage to be equal to the output common mode voltage by providing a common mode current to the center node.

6. The analog front-end receiver of claim 1, wherein the first differential signal and the second differential signal both include a high-speed AC signal.

7. The analog front-end receiver of claim 1, wherein
the active equalizer comprises a first transistor and a second transistor;
the first transistor is configured to,
receive the first input differential signal through a gate of the first transistor, and
output the first output differential signal;
the second transistor is configured to,
receive the second input differential signal through a gate of the second transistor, and
output the second output differential signal;
a same common mode voltage is applied to the gate of the first transistor and an output terminal of the first transistor; and
the same common mode voltage is applied to the gate of the second transistor and an output terminal of the second transistor.

8. The analog front-end receiver of claim 1, further comprising:
a first output resistor coupled between the first output node and an output center node; and
a second output resistor coupled between the second output node and the output center node,
wherein each of the first output resistor and the second output resistor has a resistance in a range of 5 Kohm to 20 Kohm.

9. The analog front-end receiver of claim 8, wherein
the input common mode voltage generator comprises a common mode current amplifier; and
the common mode current amplifier is configured to,
receive the output common mode voltage and the input common mode voltage, the output common mode voltage being sensed at the output center node, and
provide a common mode current to each of the first input node and the second input node.

10. The analog front-end receiver of claim 1, wherein the input common mode voltage generator is configured to:
provide a common mode current to each of the first input node and the second input node; and
maintain the input common mode voltage within a range based on the output common mode voltage.

11. An analog front-end receiver comprising:
a termination resistor configured to receive a first differential signal and a second differential signal from different data lines, the second differential signal being differential with respect to the first differential signal;
an active equalizer configured to,
receive a first input differential signal through a first input node and a second input differential signal through a second input node, the first input differential signal and the second input differential signal both having an input common mode voltage, the first input differential signal being based on the first differential signal, and the second input differential signal being based on the second differential signal, and
output a first output differential signal to a first output node and a second output differential signal to a second output node, the second output differential signal being differential with respect to the first output differential signal; and
an input common mode voltage generator configured to,
receive a reference voltage related to the first output differential signal and the second output differential signal,
provide a common mode current to each of the first input node and the second input node based on the reference voltage, and
maintain the input common mode voltage within a range based on the reference voltage.

12. The analog front-end receiver of claim 11, wherein
the reference voltage is an output common mode voltage of the first output differential signal and the second output differential signal; and
the input common mode voltage generator is configured to adjust the input common mode voltage to be equal to the output common mode voltage.

13. The analog front-end receiver of claim 11, wherein the input common mode voltage generator is configured to maintain a voltage difference between the input common mode voltage and the reference voltage within a range of 10 mV.

14. The analog front-end receiver of claim 11, wherein
the reference voltage is an output common mode voltage of the first output differential signal and the second output differential signal;
the input common mode voltage generator comprises a common mode current amplifier; and
the common mode current amplifier is configured to receive the output common mode voltage sensed at an output center node between the first output node and the second output node.

15. The analog front-end receiver of claim 14, wherein the common mode current amplifier is configured to provide the common mode current to each of the first input node and the second input node based on a voltage difference between the output common mode voltage and the input common mode voltage.

16. An electronic device comprising:
a physical layer configured to,
receive a first differential signal and a second differential signal through an interface, the second differential signal being differential with respect to the first differential signal, and output digital data corresponding to the first differential signal and the second differential signal;

a link layer configured to output a control signal to a driving device based on the digital data; and the driving device in which a program is executed based on the control signal, wherein the physical layer includes:

a termination resistor configured to receive the first differential signal and the second differential signal from different data lines, an active equalizer configured to, receive a first input differential signal through a first input node and a second input differential signal through a second input node, the first input differential signal and the second differential signal both having an input common mode voltage, the first input differential signal being based on the first differential signal, and the second input differential signal being based on the second differential signal, and output a first output differential signal to a first output node and a second output differential signal to a second output node, the second output differential signal being differential with respect to the first output differential signal, and an input common mode voltage generator configured to adjust the input common mode voltage to be equal to an output common mode voltage of the first output differential signal.

17. The electronic device of claim 16, wherein the interface supports a peripheral component interconnect (PCI) express (PCIe) interface, a serial attached small computer system interface (SCSI) (SAS) interface, or a serial advanced technology attachment (SATA) interface.

18. The electronic device of claim 17, wherein the first differential signal and the second differential signal both include a high-speed AC signal.

19. The electronic device of claim 16, wherein the input common mode voltage generator is configured to:

provide a common mode current to each of the first input node and the second input node; and maintain the input common mode voltage within a range based on the output common mode voltage.

20. The electronic device of claim 16, wherein the active equalizer comprises a first transistor and a second transistor;

the first transistor is configured to, receive the first input differential signal through a gate of the first transistor, and output the first output differential signal;

the second transistor is configured to, receive the second input differential signal through a gate of the second transistor, and output the second output differential signal;

a same common mode voltage is applied to the gate of the first transistor and an output terminal of the first transistor; and the same common mode voltage is applied to the gate of the second transistor and an output terminal of the second transistor.

* * * * *